US012672396B2

(12) United States Patent
Lee et al.

(10) Patent No.:   US 12,672,396 B2
(45) Date of Patent:      Jun. 30, 2026

(54) LIGHT-EMITTING ELEMENT, DISPLAY DEVICE INCLUDING THE SAME, AND SEMICONDUCTOR STRUCTURE

(71) Applicant: Samsung Display Co., LTD., Yongin-si (KR)

(72) Inventors: Won Ho Lee, Suwon-si (KR); Seung A Lee, Seoul (KR); Jin Hyuk Jang, Hwaseong-si (KR); Jong Hyuk Kang, Suwon-si (KR); Hyun Deok Im, Seoul (KR); Sang Ho Jeon, Hwaseong-si (KR); Eun A Cho, Gunpo-si (KR); Hyun Min Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 771 days.

(21) Appl. No.: 17/585,864

(22) Filed: Jan. 27, 2022

(65)        Prior Publication Data

US 2022/0344536 A1      Oct. 27, 2022

(30)        Foreign Application Priority Data

Apr. 21, 2021    (KR) ........................ 10-2021-0051513

(51) Int. Cl.
    *H10H 20/81*        (2025.01)
    *H10H 20/825*       (2025.01)
    *H10W 90/00*        (2026.01)
(52) U.S. Cl.
    CPC ........ *H10H 20/8215* (2025.01); *H10W 90/00* (2026.01); *H10H 20/8252* (2025.01)

(58) Field of Classification Search
    CPC ... H01L 33/025; H01L 25/167; H01L 33/325; H01L 33/24; H01L 33/20; H01L 33/02;
    (Continued)

(56)        References Cited

U.S. PATENT DOCUMENTS 10,026,794 B2    7/2018   Jo et al.
11,276,834 B2    3/2022   Sudo et al.
           (Continued)

FOREIGN PATENT DOCUMENTS

CN        112437988 A      3/2021
EP        3 848 983        7/2021
           (Continued)

OTHER PUBLICATIONS

English translation of "WO 2020017718 A1" Li et al., "Light-Emitting Device, Manufacturing Method Therefor, and Display Device Comprising Same, Jan. 23, 2020" (Year: 2020).*
           (Continued)

*Primary Examiner* — Mounir S Amer
*Assistant Examiner* — Nicholas B Michaud
(74) *Attorney, Agent, or Firm* — Womble Bond Dickinson (US) LLP

(57)        ABSTRACT

A light-emitting element includes a first semiconductor layer doped with an n-type dopant, a second semiconductor layer doped with a p-type dopant, a light emitting layer disposed between the first semiconductor layer and the second semiconductor layer, and an insulating film that surrounds the first semiconductor layer, the second semiconductor layer, and the light emitting layer. A doping concentration of the first semiconductor layer is in a predetermined range. A display device includes the light-emitting element.

9 Claims, 24 Drawing Sheets

(58) Field of Classification Search
CPC ... H01L 27/156; H01L 33/14; H01L 33/0008; H01L 33/36; H01L 33/54; H01L 27/153
USPC .......................................................... 257/91
See application file for complete search history.

(56) References Cited

U.S. PATENT DOCUMENTS

| | | | | |
|---|---|---|---|---|
| 12,021,170 | B2 | 6/2024 | Li et al. | |
| 2002/0171091 | A1* | 11/2002 | Goetz | H10H 20/81 |
| | | | | 438/47 |
| 2013/0307001 | A1 | 11/2013 | Lee et al. | |
| 2015/0030046 | A1* | 1/2015 | Aoki | H10H 20/8242 |
| | | | | 372/45.012 |
| 2016/0064598 | A1* | 3/2016 | Choi | H10H 20/8162 |
| | | | | 257/13 |
| 2017/0133563 | A1* | 5/2017 | Chung | H01L 33/60 |
| 2017/0148949 | A1* | 5/2017 | Lan | H10H 20/825 |
| 2017/0170360 | A1 | 6/2017 | Bour et al. | |
| 2017/0222087 | A1* | 8/2017 | Eichler | H10N 30/50 |
| 2021/0202450 | A1 | 7/2021 | Min et al. | |
| 2021/0367024 | A1* | 11/2021 | Kim | H10K 59/123 |
| 2022/0068892 | A1* | 3/2022 | Cha | H01L 27/1214 |
| 2022/0140186 | A1 | 5/2022 | Min et al. | |
| 2022/0302350 | A1 | 9/2022 | Moon | |

FOREIGN PATENT DOCUMENTS

| | | | | |
|---|---|---|---|---|
| EP | 3 929 989 | 12/2021 | | |
| KR | 10-2015-0006798 | 1/2015 | | |
| KR | 10-2018-0137017 | 12/2018 | | |
| KR | 10-1924372 | 12/2018 | | |
| KR | 10-2020-0102615 | 9/2020 | | |
| KR | 10-2021-0022800 A | 3/2021 | | |
| TW | 201731091 A | 9/2017 | | |
| WO | 2017/110549 A1 | 6/2017 | | |
| WO | WO-2020017718 A1 * | 1/2020 | ......... | H01L 25/0753 |
| WO | 2020/0050468 | 3/2020 | | |
| WO | 2020/0171322 | 8/2020 | | |

OTHER PUBLICATIONS

Extended European Search Report, corresponding to European Application No./Patent No. 22156447.9, dated Aug. 4, 2022.

* cited by examiner

NDA

10

DPA

DR1

DR2

PX

CTD CTS   SPX1   SPX2   SPX3

BNL

N2

ED

BP1

BP2

CNE1

CNE2

RME1

RME2

EMA

N1   N1

N3

N3

ROP CT1   CT2 SA

DR1

DR2

RME: RME1, RME2
CNE: CNE1, CNE2

LIGHT-EMITTING ELEMENT, DISPLAY DEVICE INCLUDING THE SAME, AND SEMICONDUCTOR STRUCTURE

CROSS REFERENCE TO RELATED APPLICATION(S)

This application claims priority to and benefits of Korean Patent Application No. 10-2021-0051513 under 35 U.S.C. § 119, filed on Apr. 21, 2021 in the Korean Intellectual Property Office, the entire contents of which are incorporated herein by reference.

BACKGROUND

1. Technical Field

The disclosure relates to a light-emitting element, a display device including the same, and a semiconductor structure.

2. Description of the Related Art

Display devices are becoming increasingly important with the continuing development of multimedia. Accordingly, various types of display devices such as organic light emitting displays and liquid crystal displays are being developed and used.

Among display devices, there is a self-luminous display device that may include a light-emitting element. The self-luminous display device may be an organic light emitting display that includes an organic material as a light emitting material for a light-emitting element or may be an inorganic light emitting display that includes an inorganic material as a light emitting material for a light-emitting element.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a light-emitting element which includes a semiconductor layer having an index of doping concentration in a specific range and a display device including the light-emitting element.

Aspects of the disclosure also provide a light-emitting element and a semiconductor structure which include a semiconductor layer having a doping concentration in a specific range and a doping concentration profile.

However, aspects of the disclosure are not restricted to those set forth herein. The above and other aspects of the disclosure will become more apparent to one of ordinary skill in the art to which the disclosure pertains by referencing the detailed description of the disclosure given below.

A light-emitting element according to an embodiment includes a semiconductor layer having a doping concentration index value equal to or greater than a value of an embodiment to have a large dipole moment.

A display device according to an embodiment includes the above light-emitting elements. Accordingly, the proportion of forward-oriented light-emitting elements may increase, and the luminous efficiency and manufacturing yield may increase.

According to an embodiment of the disclosure, a light-emitting element may include a first semiconductor layer doped with an n-type dopant, a second semiconductor layer doped with a p-type dopant, a light emitting layer disposed between the first semiconductor layer and the second semiconductor layer, and an insulating film that surrounds the first semiconductor layer, the second semiconductor layer, and the light emitting layer, wherein an index of doping concentration of the first semiconductor layer as expressed by Equation 1 may be equal to or greater than about $2.5*10^{11}$ atoms/cm:

$$IDC \ (\text{Index of doping concentration}) = \int_{l0}^{l} n(x)x dx \qquad \text{[Equation 1]}$$

In Equation 1, $l_0$ may be the position of an interface between a semiconductor layer and the light emitting layer, l may be the position of an end surface of the semiconductor layer which is opposite the interface with the light emitting layer, x may be a distance from $l_0$ to l, and n(x) may be the doping concentration of a dopant according to an x value of the semiconductor layer.

In an embodiment, the index of doping concentration of the first semiconductor layer may be equal to or greater than about $4*10^{11}$ atoms/cm.

In an embodiment, the first semiconductor layer may include a first doped region and a second doped region having a greater doping concentration of the n-type dopant than the first doped region.

In an embodiment, the first doped region may have a length different from a length of the second doped region, and the first doped region may contact the light emitting layer.

In an embodiment, the first semiconductor layer may include a first doped region that contacts the light emitting layer, a second doped region that contacts the first doped region and may have a doping concentration of the n-type dopant different from a doping concentration of the first doped region, and a third doped region that contacts the second doped region and may have a doping concentration of the n-type dopant different from a coping concentration of the second doped region.

In an embodiment, the first doped region may be longer than each of the second doped region and the third doped region, and the second doped region may be shorter than the third doped region.

In an embodiment, the doping concentration of the n-type dopant of the first doped region may be greater than the doping concentration of the n-type dopant of each of the second doped region and the third doped region, and the doping concentration of the n-type dopant of the second doped region may be greater than the doping concentration of the n-type dopant of the third doped region.

In an embodiment, the first doped region may be shorter than each of the second doped region and the third doped region, and the second doped region may be longer than the third doped region.

In an embodiment, the doping concentration of the n-type dopant of the first doped region may be less than the doping concentration of the n-type dopant of the second doped region, and the doping concentration of the n-type dopant of the second doped region may be less than the doping concentration of the n-type dopant of the third doped region.

In an embodiment, the doping concentration of the n-type dopant of the first doped region may be greater than the doping concentration of the n-type dopant of the second doped region, and the doping concentration of the n-type dopant of the third doped region may be the same as the doping concentration of the n-type dopant of the first doped region.

According to an embodiment of the disclosure, a display device may include a first electrode and a second electrode disposed on a substrate and spaced apart from each other, a first insulating layer disposed on the first electrode and the second electrode, light-emitting elements disposed on the first insulating layer and disposed on the first electrode and the second electrode, a first connection electrode that contacts an end of each of the light-emitting elements, and a second connection electrode that contacts another end of each of the light-emitting elements, wherein each of the light-emitting elements may include a first semiconductor layer doped with an n-type dopant, a second semiconductor layer doped with a p-type dopant, a light emitting layer disposed between the first semiconductor layer and the second semiconductor layer, and an insulating film that surrounds the first semiconductor layer, the second semiconductor layer, and the light emitting layer. An index of doping concentration of the first semiconductor layer as expressed by Equation 1 may be equal to or greater than about $2.5*10^{11}$ atoms/cm, and a number of light-emitting elements may include first ends at which the first semiconductor layer is disposed and second ends opposite to the first ends, wherein the first ends may contact the second connection electrode and the second ends may contact the first connection electrode, and a proportion of the number of light-emitting elements among the light-emitting elements may be equal to or greater than about 60%:

$$IDC \text{ (Index of doping concentration)} = \int_{l0}^{l} n(x)x dx \qquad \text{[Equation 1]}$$

In Equation 1, $l_0$ may be the position of an interface between a semiconductor layer and the light emitting layer, I may be the position of an end surface of the semiconductor layer which is opposite the interface with the light emitting layer, x may be a distance from $l_0$ to l, and n(x) may be the doping concentration of a dopant according to an x value of the semiconductor layer.

In an embodiment, the index of doping concentration of the first semiconductor layer in each of the light-emitting elements may be equal to or greater than about $4*10^{11}$ atoms/cm, a number of light-emitting elements may include first ends at which the first semiconductor layer is disposed and second ends opposite to the first ends, wherein the first ends may contact the second connection electrode and the second ends may contact the first connection electrode, and a proportion of the number of light-emitting elements among the light-emitting elements may be equal to or greater than about 80%.

In an embodiment, the first semiconductor layer may include a first doped region that contacts the light emitting layer, and a second doped region having a doping concentration of the n-type dopant greater than a doping concentration of the n-type dopant of the first doped region, and the first doped region may be longer than the second doped region.

In an embodiment, the first semiconductor layer may include a first doped region that contacts the light emitting layer, a second doped region that contacts the first doped region and having a doping concentration of the n-type dopant different from a doping concentration of the n-type dopant of the first doped region, and a third doped region that contacts the second doped region and having a doping concentration of the n-type dopant different from a doping concentration of the n-type dopant of the second doped region.

In an embodiment, the first doped region may be longer than each of the second doped region and the third doped region, the second doped region may be shorter than the third doped region, the doping concentration of the n-type dopant of the first doped region may be greater than the doping concentration of the n-type dopant of each of the second doped region and the third doped region, and the doping concentration of the n-type dopant of the second doped region may be greater than the doping concentration of the n-type dopant of the third doped region.

In an embodiment, the first doped region may be shorter than each of the second doped region and the third doped region, the second doped region may be longer than the third doped region, the doping concentration of the n-type dopant of the first doped region may be less than the doping concentration of the n-type dopant of the second doped region, and the doping concentration of the n-type dopant of the second doped region may be less than the doping concentration of the n-type dopant of the third doped region.

According to an embodiment of the disclosure, a semiconductor structure may include a first semiconductor layer doped with an n-type dopant, a second semiconductor layer doped with a p-type dopant, a light emitting layer disposed between the first semiconductor layer and the second semiconductor layer, and an insulating film that surrounds the first semiconductor layer, the second semiconductor layer, and the light emitting layer, wherein a doping concentration of the n-type dopant of the first semiconductor layer may be equal to or greater than about $1*10^{18}$ atoms/cm$^3$.

In an embodiment, the doping concentration of the n-type dopant of the first semiconductor layer may be equal to or greater than about $6*10^{18}$ atoms/cm$^3$.

In an embodiment, the first semiconductor layer may include a first doped region, and a second doped region having a doping concentration of the n-type dopant greater than a doping concentration of the n-type dopant of the first doped region.

In an embodiment, the first doped region may have a length different from a length of the second doped region, and the first doped region may contact the light emitting layer.

In an embodiment, the first semiconductor layer may include a first doped region that contacts the light emitting layer, a second doped region that contacts the first doped region and may have a different doping concentration of the n-type dopant from the first doped region, and a third doped region that contacts the second doped region and may have a different doping concentration of the n-type dopant from the second doped region.

In an embodiment, the first doped region may be longer than each of the second doped region and the third doped region, and the second doped region may be shorter than the third doped region.

In an embodiment, the doping concentration of the n-type dopant of the first doped region may be equal to or greater than about $6*10^{18}$ atoms/cm$^3$, and a doping concentration of the n-type dopant of each of the second doped region and the third doped region may be equal to or less than about $6*10^{18}$ atoms/cm$^3$.

In an embodiment, the first doped region may be shorter than each of the second doped region and the third doped region, the second doped region may be longer than the third doped region, the doping concentration of the n-type dopant of the first doped region may be less than the doping concentration of the n-type dopant of the second doped region, and the doping concentration of the n-type dopant of the second doped region may be less than the doping concentration of the n-type dopant of the third doped region.

In an embodiment, the doping concentration of the n-type dopant of each of the first doped region and the second doped region may be equal to or less than about $6*10^{18}$ atoms/cm$^3$, and the doping concentration of the n-type dopant of the third doped region may be equal to or greater than about $6*10^{18}$ atoms/cm$^3$.

In an embodiment, the doping concentration of the n-type dopant of each of the first doped region and the third doped region may be equal to or greater than about $6*10^{18}$ atoms/cm$^3$, and the doping concentration of the n-type dopant of the second doped region may be equal to or less than about $6*10^{18}$ atoms/cm$^3$.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
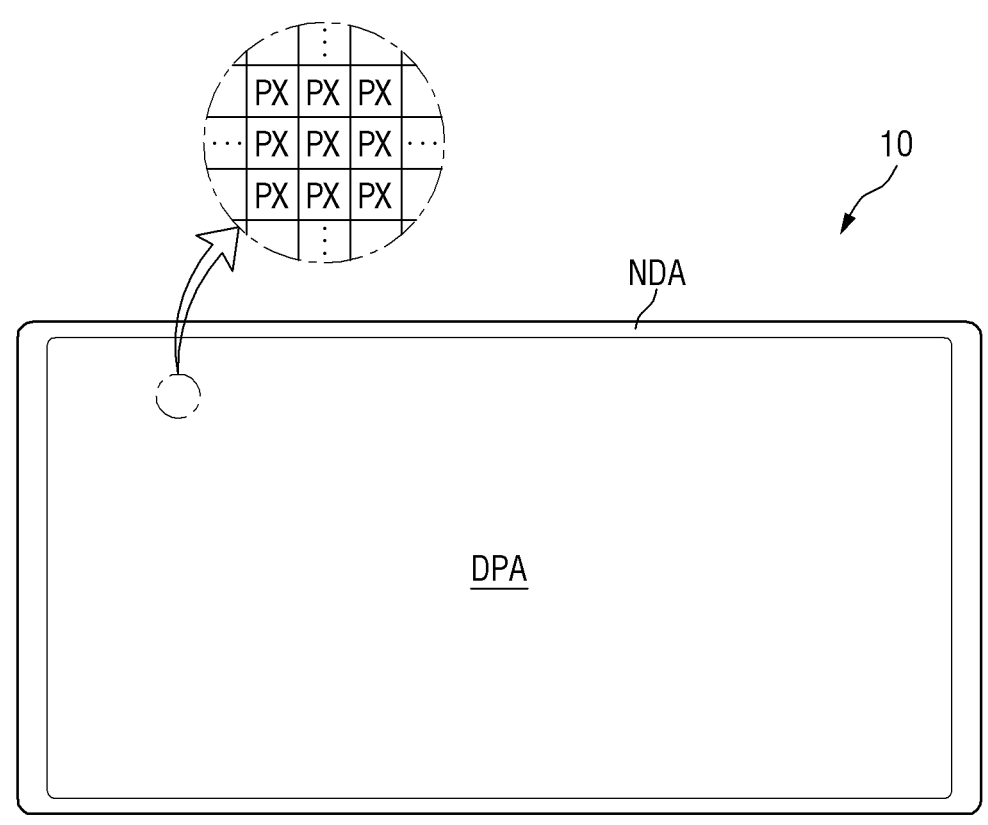
FIG. 1 is a schematic plan view of a display device according to an embodiment.
Figure 1:
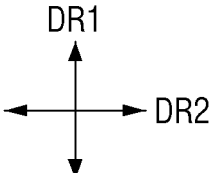

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

It will be understood that the terms "connected to" or "coupled to" may include a physical or electrical connection or coupling.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described with reference to the attached drawings.

FIG. 1 is a schematic plan view of a display device 10 according to an embodiment.

Referring to FIG. 1, the display device 10 displays moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMI's), navigation devices, game machines, digital cameras, and camcorders, all of which provide a display screen.

The display device 10 may include a display panel that provides a display screen. Examples of the display panel may include inorganic light emitting diode display panels, organic light emitting display panels, quantum dot light emitting display panels, plasma display panels, and field emission display panels. An example in which an inorganic light emitting diode display panel is applied as an example of the display panel will be described below, but the disclosure is not limited thereto, and other display panels can also be applied as long as the same technical spirit is applicable.

A shape of the display device 10 may be variously modified. For example, the display device 10 may have a shape such as a horizontally long rectangle, a vertically long rectangle, a square, a quadrangle with rounded corners (vertices), other polygons, or a circle. The shape of a display area DPA of the display device 10 may also be similar to the overall shape of the display device 10. In FIG. 1, the display device 10 having a shape like a rectangle that is long in a second direction DR2 is illustrated.

The display device 10 may include the display area DPA and a non-display area NDA. The display area DPA may be an area where a screen may be displayed, and the non-display area NDA may be an area where no screen is displayed. The display area DPA may be referred to as an active area, and the non-display area NDA may be referred to as an inactive area. The display area DPA may generally occupy an inner region of the display device 10.

The display area DPA may include pixels PX. The pixels PX may be arranged in a matrix form. Each of the pixels PX may be rectangular or square in a plan view. However, the disclosure is not limited thereto, and each of the pixels PX may also have a rhombus shape having each side inclined with respect to a direction. The pixels PX may be arranged in a stripe configuration or a PENTILE™ configuration. Each of the pixels PX may display a specific color by including one or more light-emitting elements which emit light of a specific wavelength band.

The non-display area NDA may be disposed around the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. Wirings or circuit drivers included in the display device 10 may be disposed in each non-display area NDA, or external devices may be mounted in the non-display area NDA.

Figure 2:
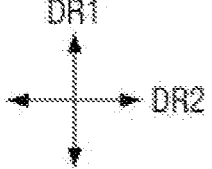
FIG. 2 is a schematic plan view of a pixel of the display device according to the embodiment.

FIG. 2 is a schematic plan view of a pixel PX of the display device 10 according to an embodiment.

Referring to FIG. 2, each of the pixels PX of the display device 10 may include subpixels SPXn (where n is 1 to 3). For example, a pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, the disclosure is not limited thereto, and the subpixels SPXn may emit light of a same color. In an embodiment, the subpixels SPXn may each emit blue light. Although a pixel PX includes three subpixels SPXn in the drawing, the disclosure is not limited thereto, and the pixel PX may also include a greater number of subpixels SPXn.

Each subpixel SPXn of the display device 10 may include an emission area EMA and a non-emission area. The emission area EMA may be an area in which light-emitting elements ED are disposed to emit light of a specific wavelength band. The non-emission area may be an area in which the light-emitting elements ED are not disposed and from which no light is output because light from the light-emitting elements ED does not reach this area.

The emission area EMA may include an area in which the light-emitting elements ED are disposed and an area which is adjacent to the light-emitting elements ED and from which light from the light-emitting elements ED is output. However, the disclosure is not limited thereto, and the emission area EMA may also include an area from which light from the light-emitting elements ED is output after being reflected or refracted by other members. Light-emitting elements ED may be disposed in each subpixel SPXn, and an area where the light-emitting elements ED are disposed and an area adjacent to this area may form the emission area EMA.

Although the respective emission areas EMA of the subpixels SPXn have substantially a same area in the drawing, the disclosure is not limited thereto. In embodiments, the emission area EMA of each subpixel SPXn may have an area that varies according to a color or wavelength band of light from the light-emitting elements ED disposed in the subpixel SPXn.

Each subpixel SPXn may further include a sub-area SA disposed in the non-emission area. The sub-area SA may be disposed on a side of the emission area EMA in a first direction DR1 and may be disposed between the emission areas EMA of subpixels SPXn neighboring in the first direction DR1. For example, emission areas EMA and sub-areas SA may be repeatedly arranged in the second direction DR2 but may be alternately arranged in the first direction DR1. However, the disclosure is not limited thereto, and an arrangement of the emission areas EMA and the sub-areas SA in pixels PX may also be different from that in FIG. 2.

A bank layer BNL may be disposed between the sub-areas SA and the emission areas EMA, and a distance between them may vary according to a width of the bank layer BNL. Light may not emit from the sub-area SA because the light-emitting elements ED are not disposed in the sub-area SA, but parts of electrodes RME disposed in each subpixel SPXn may be disposed in the sub-area SA. The electrodes RME disposed in different subpixels SPXn may be separated from each other in a separation part ROP of the sub-area SA.

The bank layer BNL may include parts extending in the first direction DR1 and the second direction DR2 in a plan view to form a grid pattern in the entire display area DPA. The bank layer BNL may be disposed at the boundary of each subpixel SPXn to separate neighboring subpixels SPXn. The bank layer BNL may surround the emission area EMA disposed in each subpixel SPXn to separate them from each other.

Figure 3:
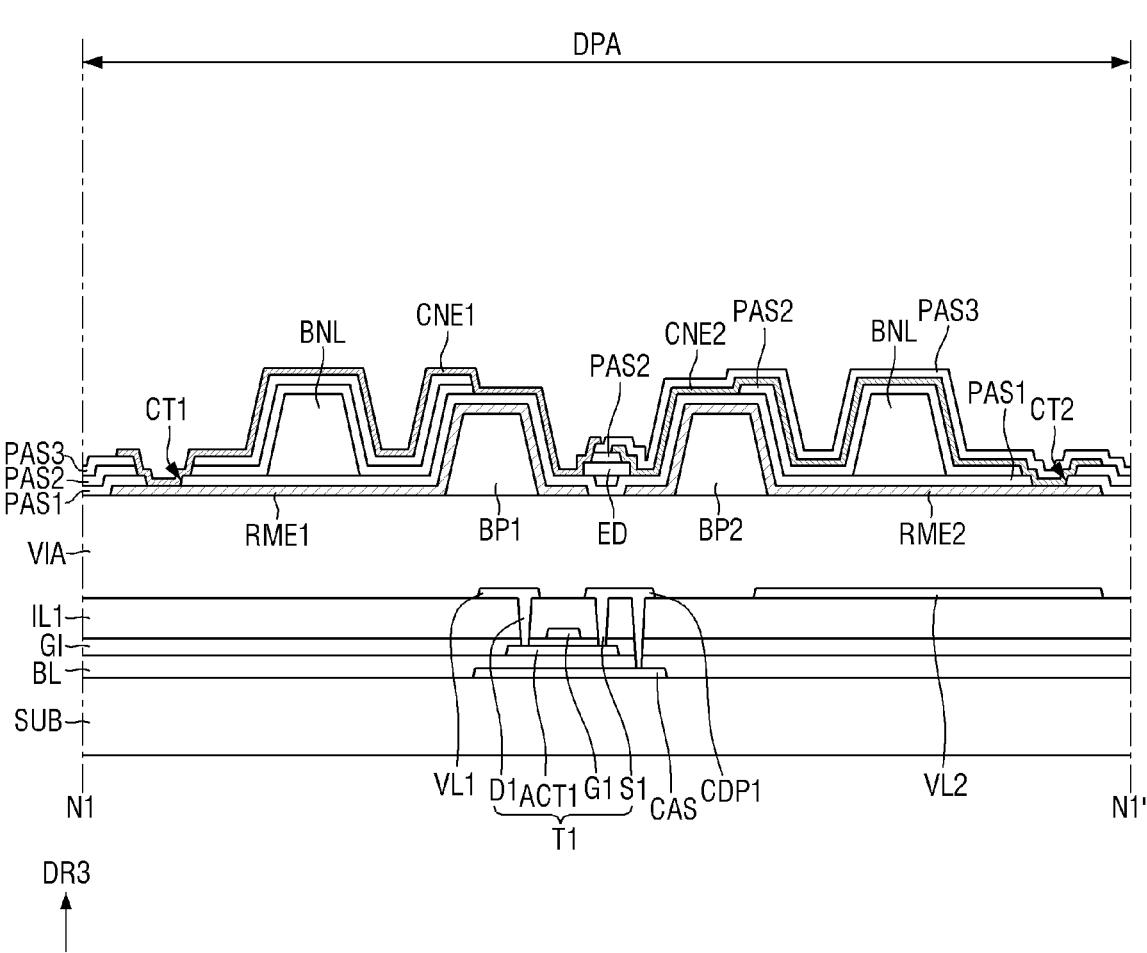
FIG. 3 is a schematic cross-sectional view taken along line N1-N1' of FIG. 2.
Figure 4:
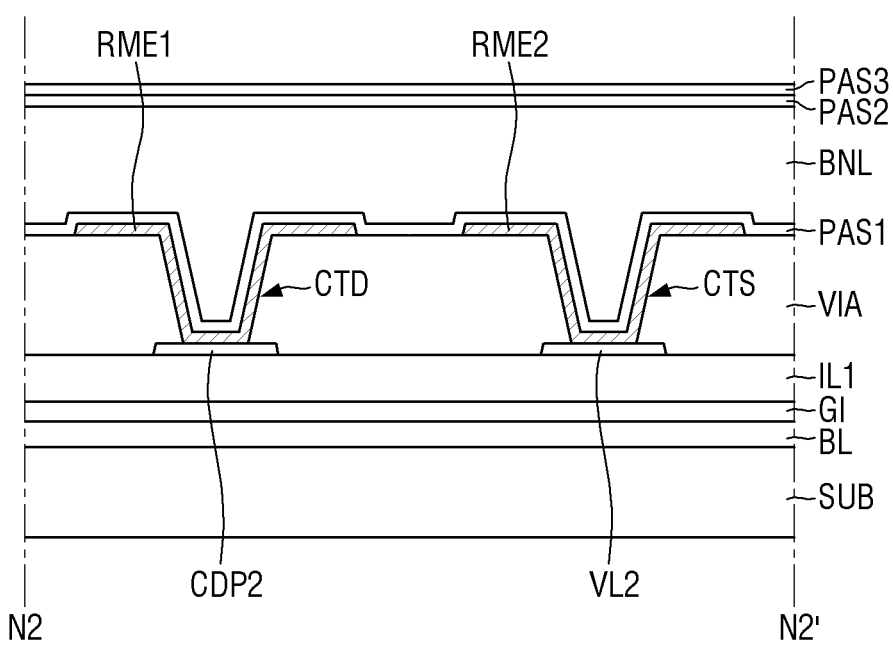
FIG. 4 is a schematic cross-sectional view taken along line N2-N2' of FIG. 2.

FIG. 3 is a schematic cross-sectional view taken along line N1-N1' of FIG. 2. FIG. 4 is a schematic cross-sectional view taken along line N2-N2' of FIG. 2. FIG. 3 illustrates a cross section across a light-emitting element ED disposed in the first subpixel SPX1, and FIG. 4 illustrates a cross section across contact holes CTD and CTS.

Referring to FIGS. 3 and 4 in conjunction with FIG. 2, the display device 10 may include a substrate SUB and a semiconductor layer, conductive layers, and insulating layers disposed on the substrate SUB. The semiconductor layer, the conductive layers, and the insulating layers may constitute a circuit layer and a display element layer of the display device 10.

The substrate SUB may be an insulating substrate. The substrate SUB may be made of an insulating material such as glass, quartz, or polymer resin. The substrate SUB may be a rigid substrate, but may also be a flexible substrate that may be bent, folded, rolled, etc.

A first conductive layer may be disposed on the substrate SUB. The first conductive layer includes a bottom metal layer CAS, and the bottom metal layer CAS is overlapped by an active layer ACT1 of a first transistor T1. The bottom metal layer CAS may include a light blocking material to prevent light from entering the active layer ACT1 of the first transistor T1. However, the bottom metal layer CAS may also be omitted.

A buffer layer BL may be disposed on the bottom metal layer CAS and the substrate SUB. The buffer layer BL may be formed on the substrate SUB to protect transistors of the pixels PX from moisture introduced through the substrate SUB which may be vulnerable to moisture penetration and may provide a surface planarization function.

The semiconductor layer may be disposed on the buffer layer BL. The semiconductor layer may include the active layer ACT1 of the first transistor T1. The active layer ACT1 may partially overlap a gate electrode G1 of a second conductive layer which will be described later.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 may be disposed in each subpixel SPXn of the display device 10 in the drawings, the disclosure is not limited thereto, and the display device 10 may include a greater number of transistors.

A first gate insulating layer GI may be disposed on the semiconductor layer and the buffer layer BL. The first gate insulating layer GI may serve as a gate insulating film of the first transistor T1.

The second conductive layer may be disposed on the first gate insulating layer GI. The second conductive layer may include the gate electrode G1 of the first transistor T1. The gate electrode G1 may overlap a channel region of the active layer ACT1 in a third direction DR3 which is a thickness direction.

A first interlayer insulating layer IL1 may be disposed on the second conductive layer. The first interlayer insulating layer IL1 may function as an insulating film between the second conductive layer and other layers disposed on the second conductive layer and may protect the second conductive layer.

A third conductive layer may be disposed on the first interlayer insulating layer IL1. The third conductive layer may include a first voltage line VL1 and a second voltage line VL2 disposed in the display area DPA and conductive patterns CDP1 and CDP2.

A high potential voltage (or a first power supply voltage) supplied to a first electrode RME1 may be applied to the first voltage line VL1, and a low potential voltage (or a second power supply voltage) supplied to a second electrode RME2 may be applied to the second voltage line VL2. A part of the first voltage line VL1 may contact the active layer ACT1 of the first transistor T1 through a contact hole penetrating the first interlayer insulating layer IL1 and the first gate insulating layer GI. The first voltage line VL1 may serve as a first drain electrode D1 of the first transistor T1. The second voltage line VL2 may be directly connected to the second electrode RME2 to be described later.

A first conductive pattern CDP1 may contact the active layer ACT1 of the first transistor T1 through a contact hole penetrating the first interlayer insulating layer IL1 and the first gate insulating layer GI. The first conductive pattern CDP1 may contact the bottom metal layer CAS through another contact hole. The first conductive pattern CDP1 may serve as a source electrode S1 of the first transistor T1.

A second conductive pattern CDP2 may be connected to the first electrode RME1 to be described later. The second conductive pattern CDP2 may be electrically connected to the first transistor T1 through the first conductive pattern CDP1. In the drawings, the first conductive pattern CDP1 and the second conductive pattern CDP2 are separated from each other. However, in embodiments, the second conductive pattern CDP2 may be integrated with the first conductive pattern CDP1 to form one pattern. The first transistor T1 may transmit the first power supply voltage received from the first voltage line VL1 to the first electrode RME1.

Although the first conductive pattern CDP1 and the second conductive pattern CDP2 are formed on a same layer in the drawings, the disclosure is not limited thereto. In embodiments, the second conductive pattern CDP2 may be formed of a different conductive layer from the first conductive pattern CDP1, for example, may be formed of a fourth conductive layer disposed on the third conductive layer with some insulating layers interposed between them. The first voltage line VL1 and the second voltage line VL2 may also be formed of the fourth conductive layer instead of the third conductive layer, and the first voltage line VL1 may be electrically connected to the drain electrode D1 of the first transistor T1 through another conductive pattern.

Each of the buffer layer BL, the first gate insulating layer GI, and the first interlayer insulating layer IL1 described above may be composed of inorganic layers stacked alternately. For example, each of the buffer layer BL, the first gate insulating layer GI, and the first interlayer insulating layer IL1 may be a double layer in which inorganic layers including at least any one of silicon oxide ($SiO_x$), silicon nitride ($SiN_x$) and silicon oxynitride ($SiO_xN_y$) are stacked or may be a multilayer in which the above materials are alternately stacked. However, the disclosure is not limited thereto, and each of the buffer layer BL, the first gate insulating layer GI, and the first interlayer insulating layer IL1 may also be composed of one inorganic layer including any one of the above insulating materials. In embodiments, the first interlayer insulating layer IL1 may be made of an organic insulating material such as polyimide (PI).

Each of the second conductive layer and the third conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), or an alloy thereof.

A via layer VIA may be disposed on the third conductive layer. The via layer VIA may include an organic insulating material such as polyimide (PI) and may provide a surface planarization function.

Bank patterns BP1 and BP2, electrodes RME (RME1 and RME2), the bank layer BNL, light-emitting elements ED, and connection electrodes CNE (CNE1 and CNE2) are disposed as the display element layer on the via layer VIA. Insulating layers PAS1 through PAS3 may be disposed on the via layer VIA.

The bank patterns BP1 and BP2 may be directly disposed on the via layer VIA. The bank patterns BP1 and BP2 may extend in the first direction DR1 and may be spaced apart from each other in the second direction DR2. For example, the bank patterns BP1 and BP2 may include a first bank pattern BP1 and a second bank pattern BP2 spaced apart from each other in the emission area EMA of each subpixel SPXn. The first bank pattern BP1 may be disposed on a left side of the center of the emission area EMA which is a side in the second direction DR2, and the second bank pattern BP2 may be disposed on a right side of the center of the emission area EMA which is the other side in the second direction DR2. The light-emitting elements ED may be disposed between the first bank pattern BP1 and the second bank pattern BP2.

A length of each of the bank patterns BP1 and BP2 extending in the first direction DR1 may be less than a length, in the first direction DR1, of the emission area EMA surrounded by the bank layer BNL. The bank patterns BP1 and BP2 may be disposed in the emission area EMA of each subpixel SPXn in the entire display area DPA to form island patterns having a narrow width and extending in one direction. Although two bank patterns BP1 and BP2 having a same width are disposed in each subpixel SPXn in the drawings, the disclosure is not limited thereto. The number and shape of the bank patterns BP1 and BP2 may vary according to the number or arrangement structure of the electrodes RME.

At least a part of each of the bank patterns BP1 and BP2 may protrude from an upper surface of the via layer VIA. The protruding parts of the bank patterns BP1 and BP2 may have inclined side surfaces, and light from the light-emitting elements ED may be reflected upward from the via layer VIA by the electrodes RME disposed on the bank patterns BP1 and BP2. However, the disclosure is not limited thereto, and each of the bank patterns BP1 and BP2 may also have a semicircular or semielliptical shape having a curved outer surface. The bank patterns BP1 and BP2 may include, but are not limited to, an organic insulating material such as polyimide (PI).

Each of the electrodes RME may extend in one direction and may be disposed in each subpixel SPXn. The electrodes RME may extend in the first direction DR1, may be disposed in the emission area EMA of each subpixel SPXn, and may be spaced apart from each other in the second direction DR2. The electrodes RME may be electrically connected to the light-emitting elements ED. Each of the electrodes RME may be connected to the light-emitting elements ED through a connection electrode CNE (CNE1 or CNE2) to be described later and may transmit an electrical signal received from a conductive layer disposed thereunder to the light-emitting elements ED.

The display device 10 includes the first electrode RME1 and the second electrode RME2 disposed in each subpixel SPXn. The first electrode RME1 may be disposed on the left side of the center of the emission area EMA, and the second electrode RME2 may be spaced apart from the first electrode RME1 in the second direction DR2 and may be disposed on the right side of the center of the emission area EMA. The first electrode RME1 may be disposed on the first bank pattern BP1, and the second electrode RME2 may be disposed on the second bank pattern BP2. The first electrode RME1 and the second electrode RME2 may extend beyond the bank layer BNL to partially lie in a corresponding subpixel SPXn and the sub-area SA. The first electrodes RME1 and the second electrodes RME2 of different subpixels SPXn may be spaced apart from each other by the separation part ROP located in the sub-area SA of a subpixel SPXn.

The first electrode RME1 and the second electrode RME2 may be respectively disposed on at least the inclined side surfaces of the bank patterns BP1 and BP2. In an embodiment, a width of each of the electrodes RME measured in the second direction DR2 may be less than a width of each of the bank patterns BP1 and BP2 measured in the second direction DR2. Each of the first electrode RME1 and the second electrode RME2 may cover at least a side surface of a bank pattern BP1 or BP2 to reflect light from the light-emitting elements ED.

A distance between the first electrode RME1 and the second electrode RME2 in the second direction DR2 may be less than a distance between the bank patterns BP1 and BP2. At least a part of each of the first electrode RME1 and the second electrode RME2 may be directly disposed on the via layer VIA so that they lie in a same plane.

As described above, the electrodes RME may be disposed on the bank patterns BP1 and BP2, and light from the light-emitting elements ED disposed between the bank patterns BP1 and BP2 may be reflected upward by the electrodes RME disposed on the bank patterns BP1 and BP2.

Each of the electrodes RME may include a conductive material having high reflectivity to reflect light from the light-emitting elements ED.

Each electrode RME may extend from the emission area EMA to the sub-area SA and may include a part overlapping the bank layer BNL and a part disposed in the sub-area SA. According to an embodiment, a part of each electrode RME in which an upper surface is partially exposed may be disposed in the sub-area SA. However, the disclosure is not limited thereto, and the part of each electrode RME in which the upper surface is partially exposed may also be disposed within the emission area EMA.

The first electrode RME1 and the second electrode RME2 may each be connected to the third conductive layer respectively through a first contact hole CTD and a second contact hole CTS formed in parts overlapping the bank layer BNL. The first electrode RME1 may contact the second conductive pattern CDP2 through the first contact hole CTD penetrating the via layer VIA under the first electrode RME1. The second electrode RME2 may contact the second voltage line VL2 through the second contact hole CTS penetrating the via layer VIA under the second electrode RME2. The first electrode RME1 may be electrically connected to the first transistor T1 through the second conductive pattern CDP2 and the first conductive pattern CDP1 to receive the first power supply voltage, and the second electrode RME2 may be electrically connected to the second voltage line VL2 to receive the second power supply voltage.

A first insulating layer PAS1 may be disposed in the entire display area DPA and may be disposed on the via layer VIA and the electrodes RME. The first insulating layer PAS1 may protect the electrodes RME while insulating them from each other. For example, since the first insulating layer PAS1 covers the electrodes RME before the bank layer BNL is formed, it may prevent the electrodes RME from being damaged in the process of forming the bank layer BNL. The first insulating layer PAS1 may prevent the light-emitting elements ED disposed thereon from directly contacting other members and thus being damaged.

In an embodiment, the first insulating layer PAS1 may be stepped such that a part of an upper surface of the first insulating layer PAS1 is depressed between the electrodes RME spaced apart from each other in the second direction DR2. The light-emitting elements ED may be disposed on the stepped upper surface of the first insulating layer PAS1, and a space may be formed between each of the light-emitting elements ED and the first insulating layer PAS1.

According to an embodiment, the first insulating layer PAS1 may cover the electrodes RME but may include openings partially exposing upper surfaces of the electrodes RME. For example, the first insulating layer PAS1 may include contact parts CT1 and CT2 each partially exposing an upper surface of the electrodes RME, respectively. A first contact part CT1 may be disposed on the first electrode RME1 in the sub-area SA, and a second contact part CT2 may be disposed on the second electrode RME2 in the sub-area SA. The connection electrodes CNE to be described later may contact the electrodes RME exposed through the first contact part CT1 and the second contact part CT2. The first insulating layer PAS1 may expose an upper surface of the via layer VIA in the separation part ROP in which the electrodes RME of different subpixels SPXn are spaced apart.

The bank layer BNL may be disposed on the first insulating layer PAS1. The bank layer BNL may include parts extending in the first direction DR1 and in the second direction DR2 and may surround each subpixel SPXn. The bank layer BNL may surround the emission area EMA and the sub-area SA of each subpixel SPXn to separate them and may surround the outermost periphery of the display area DPA to separate the display area DPA and the non-display area NDA. The bank layer BNL may be entirely disposed in the display area DPA to form a grid pattern, and areas exposed by the bank layer BNL in the display area DPA may be the emission area EMA and the sub-area SA.

Similar to the bank patterns BP1 and BP2, the bank layer BNL may have a height of an embodiment. In embodiments, an upper surface of the bank layer BNL may be at a greater height than a height of each of the bank patterns BP1 and BP2, and a thickness of the bank layer BNL may be equal to or greater than a thickness of each of the bank patterns BP1 and BP2. The bank layer BNL may prevent ink from overflowing to adjacent subpixels SPXn in an inkjet printing process during a manufacturing process of the display device 10. Similar to the bank patterns BP1 and BP2, the bank layer BNL may include an organic insulating material such as polyimide.

The light-emitting elements ED may be disposed on the first insulating layer PAS1. The light-emitting elements ED may extend in a direction, and the direction in which light-emitting elements ED extend may be parallel to the substrate SUB. As will be described later, each light-emitting element ED may include semiconductor layers disposed along the extending direction, and the semiconductor layers may be sequentially disposed along a direction parallel to an upper surface of the substrate SUB. However, the disclosure is not limited thereto. When the light-emitting elements ED have a different structure, the semiconductor layers may be arranged in a direction perpendicular to the substrate SUB.

The light-emitting elements ED may be disposed on the electrodes RME spaced apart in the second direction DR2 between the bank patterns BP1 and BP2. A length of each light-emitting element ED may be greater than a distance between the electrodes RME spaced apart in the second direction DR2. The light-emitting elements ED may be disposed such that at least one end thereof is disposed on any one of the electrodes RME or opposing ends of the light-emitting elements CD may each be disposed on different electrodes RME, respectively. A direction in which each electrode RME extends and a direction in which the light-emitting elements ED extend may be substantially perpendicular to each other. The light-emitting elements ED may be spaced apart from each other along the first direction DR1 in which each electrode RME extends and may be aligned substantially parallel to each other. However, the disclosure is not limited thereto, and the light-emitting elements ED may also be disposed obliquely to the direction in which each electrode RME extends.

The light-emitting elements ED disposed in each subpixel SPXn may each emit light of different wavelength bands depending on the materials that form the semiconductor layers described above. However, the disclosure is not limited thereto, and the light-emitting elements ED disposed in each subpixel SPXn may emit light of a same color by respectively including semiconductor layers made of a same material. The light-emitting elements ED may be electrically connected to the electrodes RME and the conductive layers under the via layer VIA by contacting the connection electrodes CNE (CNE1 and CNE2) and may emit light of a specific wavelength band in response to an electrical signal.

Each of the light-emitting elements ED may include semiconductor layers doped with dopants having different types of conductivity, and a dipole moment may be formed by charges of a dopant used to dope each semiconductor layer. The light-emitting elements ED having the dipole moment may be disposed on the electrodes RME as their orientation direction and position are changed by a force applied by an electric field generated on the electrodes RME. For example, the type of connection electrode CNE which contacts an end of each light-emitting element ED may vary according to the orientation direction of the light-emitting element ED, which may determine whether the light-emitting elements ED are electrically connected to the voltage lines VL1 and VL2 in a forward direction or a reverse direction.

The strength of the force applied to the light-emitting elements ED by the electric field may vary according to the strength of the electric field and the dipole moment magnitude of the light-emitting elements ED. As the strength of the force applied to the light-emitting elements ED by the electric field increases, the number of light-emitting elements ED oriented in a forward direction among the light-emitting elements ED may increase. This means an increase in the proportion of light-emitting elements ED which emit light normally due to a forward connection among the light-emitting elements ED disposed in each subpixel SPXn and an increase in the luminous efficiency and manufacturing yield of the display device 10.

According to an embodiment, in each light-emitting element ED, the semiconductor layers doped with different conductivity types may have a doping concentration equal to or greater than a value of an embodiment to have a large dipole moment. When the semiconductor layers have a high doping concentration value, the magnitude of the dipole moment of each light-emitting element ED may increase, and the proportion of light-emitting elements ED oriented in the forward direction among the light-emitting elements ED may increase. This will be described in detail later.

A second insulating layer PAS2 may be disposed on the light-emitting elements ED, the first insulating layer PAS1, and the bank layer BNL. The second insulating layer PAS2 may include a pattern extending in the first direction DR1 between the bank patterns BP1 and BP2 and may be disposed on the light-emitting elements ED. The pattern may partially cover outer surfaces of the light-emitting elements ED and may not cover opposing sides or opposing ends of the light-emitting elements ED. The pattern may form a linear or island pattern in each subpixel SPXn in a plan view. The pattern of the second insulating layer PAS2 may protect the light-emitting elements ED while fixing the light-emitting elements ED during the process of manufacturing the display device 10. The second insulating layer PAS2 may fill the space between each of the light-emitting elements ED and the first insulating layer PAS1 under the light-emitting element ED. A part of the second insulating layer PAS2 may be disposed on the bank layer BNL and in the sub-areas SA. A part of the second insulating layer PAS2 which is disposed in the sub-area SA may not be disposed in the first contact part CT1, the second contact part CT2, and the separation part ROP.

The connection electrodes CNE (CNE1 and CNE2) may be disposed on the electrodes RME and the light-emitting elements ED and may contact them. Each of the connection electrodes CNE may contact an end of each light-emitting element ED and contact at least any one of the electrodes RME through the contact part CT1 or CT2 penetrating the first insulating layer PAS1 and the second insulating layer PAS2.

A first connection electrode CNE1 may extend in the first direction DR1 and may be disposed on the first electrode RME1. A part of the first connection electrode CNE1 which is disposed on the first bank pattern BP1 may overlap the first electrode RME1 and extend in the first direction DR1 from this. The first connection electrode CNE1 may extend from the emission area EMA to the sub-area SA beyond the bank layer BNL. The first connection electrode CNE1 may contact the first electrode RME1 through the first contact part CT1 in the sub-area SA. The first connection electrode CNE1 may contact the light-emitting elements ED and the first electrode RME1 to transmit an electrical signal received from the first transistor T1 to the light-emitting elements ED.

A second connection electrode CNE2 may extend in the first direction DR1 and may be disposed on the second electrode RME2. A part of the second connection electrode CNE2 which is disposed on the second bank pattern BP2 may overlap the second electrode RME2 and extend in the first direction DR1 from this. The second connection electrode CNE2 may extend from the emission area EMA to the sub-area SA beyond the bank layer BNL. The second connection electrode CNE2 may contact the second electrode RME2 through the second contact part CT2 in the sub-area SA. The second connection electrode CNE2 may contact the light-emitting elements ED and the second electrode RME2 to transmit an electrical signal received from the second voltage line VL2 to the light-emitting elements ED.

A third insulating layer PAS3 may be disposed on the second connection electrode CNE2 and the second insulating layer PAS2. The third insulating layer PAS3 may be entirely disposed on the second insulating layer PAS2 to cover the second connection electrode CNE2, and the first connection electrode CNE1 may be disposed on the third insulating layer PAS3. The third insulating layer PAS3 may be entirely disposed on the via layer VIA except for an area in which the first connection electrode CNE1 is disposed. The third insulating layer PAS3 may insulate the first connection electrode CNE1 and the second connection electrode CNE2 from each other so that the first connection electrode CNE1 does not directly contact the second connection electrode CNE2.

The third insulating layer PAS3 may be entirely disposed on the sub-area SA except for a part in which the first contact part CT1 is disposed and may cover the second contact part CT2 and the separation part ROP. Since the first connection electrode CNE1 is disposed in the first contact part CT1, the third insulating layer PAS3 may expose the first contact part CT1. Since the second connection electrode CNE2 is disposed in the second contact part CT2, the third insulating layer PAS3 may cover the second contact part CT2 together with the second connection electrode CNE2. The third insulating layer PAS3 may cover the separation part ROP to directly contact the upper surface of the via layer VIA exposed between the electrodes RME spaced apart from each other.

Although not illustrated in the drawings, another insulating layer may be further disposed on the third insulating layer PAS3 and the first connection electrode CNE1. The insulating layer may protect members disposed on the substrate SUB from an external environment.

The first insulating layer PAS1, the second insulating layer PAS2, and the third insulating layer PAS3 described above may each include an inorganic insulating material or an organic insulating material.

Figure 5:
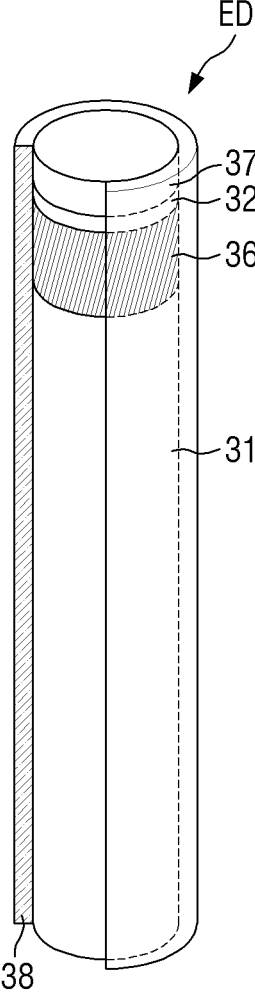
FIG. 5 is a schematic diagram of a light-emitting element according to an embodiment.
Figure 6:
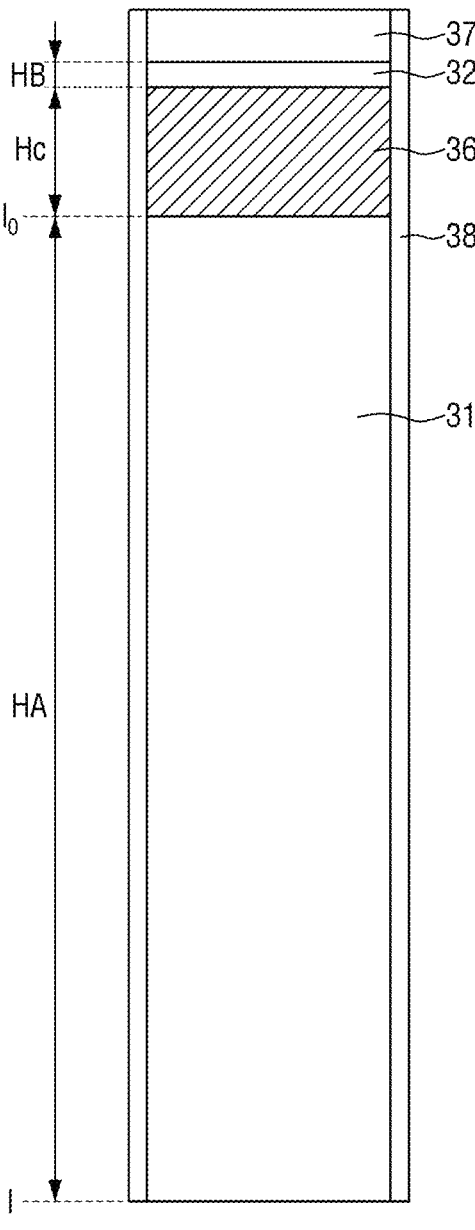
FIG. 6 is a schematic cross-sectional view of the light-emitting element of FIG. 5.

FIG. 5 is a schematic diagram of a light-emitting element ED according to an embodiment. FIG. 6 is a schematic cross-sectional view of the light-emitting element ED of FIG. 5. FIG. 6 illustrates a cross section of the light-emitting element ED of FIG. 5 taken across the center in a height direction.

Referring to FIGS. 5 and 6, the light-emitting element ED may be a light emitting diode. For example, the light-emitting element ED may be an inorganic light emitting diode having a size of nanometers to micrometers and made of an inorganic material. When an electric field is formed in a specific direction between two electrodes facing each other, the light-emitting element ED may be aligned between the two electrodes in which polarities are formed.

The light-emitting element ED according to an embodiment may extend in a direction. The light-emitting element ED may be shaped like a cylinder, a rod, a wire, a tube, or the like. However, the shape of the light-emitting element ED is not limited thereto, and the light-emitting element ED may also have various shapes including polygonal prisms, such as a cube, a rectangular parallelepiped and a hexagonal prism, and a shape extending in a direction and having a partially inclined outer surface.

The light-emitting element ED may include a semiconductor layer doped with impurities of any conductivity type (e.g., a p type or an n type). The semiconductor layer may receive an electrical signal from an external power source and emit light in a specific wavelength band. The light-emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of n-type doped AlGaInN, GaN, AlGaN, InGaN, AlN, and InN. An n-type dopant used to dope the first semiconductor layer 31 may be Si, Ge, Sn, or the like.

The second semiconductor layer 32 may be disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of p-type doped AlGaInN, GaN, AlGaN, InGaN, AlN, and InN. A p-type dopant used to dope the second semiconductor layer 32 may be Mg, Zn, Ca, Ba, or the like.

Although each of the first semiconductor layer 31 and the second semiconductor layer 32 is composed of one layer in the drawing, the disclosure is not limited thereto. Each of the first semiconductor layer 31 and the second semiconductor layer 32 may also include a greater number of layers, for example, may further include a clad layer or a tensile strain barrier reducing layer depending on the material of the light emitting layer 36.

The light emitting layer 36 may be disposed between the first semiconductor layer 31 and the second semiconductor layer 32. The light emitting layer 36 may include a material having a single or multiple quantum well structure. When the light emitting layer 36 includes a material having a multiple quantum well structure, it may have a structure in which quantum layers and well layers are alternately stacked. The light emitting layer 36 may emit light through combination of electron-hole pairs according to an electrical signal received through the first semiconductor layer 31 and the second semiconductor layer 32. The light emitting layer 36 may include a material such as AlGaN or AlGaInN. For example, when the light emitting layer 36 has a multiple quantum well structure in which a quantum layer and a well layer are alternately stacked, the quantum layer may include a material such as AlGaN or AlGaInN, and the well layer may include a material such as GaN or AlInN.

The light emitting layer 36 may have a structure in which a semiconductor material having a large band gap energy and a semiconductor material having a small band gap energy are alternately stacked or may include different Group 3 to Group 5 semiconductor materials depending on the wavelength band of light that it emits. Light from the light emitting layer 36 is not limited to light in a blue wavelength band. In embodiments, the light emitting layer 36 may emit light in a red or green wavelength band.

The electrode layer 37 may be an ohmic connection electrode. However, the disclosure is not limited thereto, and the electrode layer 37 may also be a Schottky connection electrode. The light-emitting element may include at least one electrode layer 37. The light-emitting element ED may include one or more electrode layers 37. However, the disclosure is not limited thereto, and the electrode layer 37 may also be omitted.

When the light-emitting element ED is electrically connected to an electrode or a connection electrode in the display device 10, the electrode layer 37 may reduce resistance between the light-emitting element ED and the electrode or the connection electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 may surround the first semiconductor layer 31, the second semiconductor layer 32, and the electrode layer described above. For example, the insulating film 38 may surround at least the light emitting layer 36 but may expose opposite ends of the light-emitting element ED in a longitudinal direction. An upper surface of the insulating film 38 may be rounded in cross section in an area adjacent to at least one end of the light-emitting element ED.

The insulating film 38 may include a material having insulating properties, such as silicon oxide ($SiO_x$), silicon nitride ($SiN_x$), silicon oxynitride ($SiO_xN_y$), aluminum nitride ($AlN_x$), or aluminum oxide ($AlO_x$). Although the insulating film 38 is illustrated as a single layer in the drawing, the disclosure is not limited thereto. In embodiments, the insulating film 38 may be formed in a multilayer structure in which layers are stacked.

The insulating film 38 may protect the members of the light-emitting element ED. The insulating film 38 may prevent an electrical short circuit that may occur in the light emitting layer 36 when the light emitting layer 36 directly contacts an electrode through which an electrical signal is transmitted to the light-emitting element ED. The insulating film 38 may prevent a reduction in luminous efficiency of the light-emitting element ED.

An outer surface of the insulating film 38 may be treated. The light-emitting element ED may be sprayed onto electrodes in a state where it is dispersed in an ink and may be aligned. The surface of the insulating film 38 may be hydrophobic or hydrophilic-treated so that the light-emitting element ED may remain separate from other adjacent light-emitting elements ED in the ink without being agglomerated with them.

In the light-emitting element ED, the first semiconductor layer 31 and the second semiconductor layer 32 may be doped with different conductivity types and may have an index of doping concentration calculated by Equation 1 below:

$$IDC \text{ (Index of doping concentration)} = \int_{l0}^{l} n(x)xdx \qquad \text{[Equation 1]}$$

In Equation 1, $l_0$ may be the position of an interface between a semiconductor layer and the light emitting layer 36, l may be the position of an end surface of the semiconductor layer which is opposite the interface with the light emitting layer 36, x may be a distance from $l_0$ to l, and n(x) may be the doping concentration of a dopant according to an x value of the semiconductor layer. In Equation 1, n(x) is measured in atoms/cm$^3$, and the index of doping concentration IDC is measured in atoms/cm. When the semiconductor layer is the first semiconductor layer 31, $l_0$ may be the position of an interface between the first semiconductor layer 31 and the light emitting layer 36, l may be the position of an end surface of the first semiconductor layer 31 which is opposite the interface with the light emitting layer 36, and x may be a distance or location variable that increases from $l_0$ toward 1 in the first semiconductor layer 31.

The index of doping concentration IDC may be defined as a value obtained by integrating the product of the doping concentration n(x) and the distance x according to the distance x. Accordingly, the index of doping concentration index IDC may have a different value according to the doping concentration of a dopant of a semiconductor layer 31 or 32 and the doping profile. For example, when a dopant is heavily doped into a semiconductor layer 31 or 32, the index of doping concentration IDC may increase as the value of n(x) increases. When the dopant of a semiconductor layer 31 or 32 has a different doping concentration n(x) according to position or the distance x from the interface $l_0$ with the light emitting layer 36 to the end surface l opposite the interface, the semiconductor layer 31 or 32 may have a doping concentration profile according to position, and the index of doping concentration IDC may vary according to the doping concentration profile.

As described above, the first connection electrode CNE1 may contact an end of each of the light-emitting elements ED and the second connection electrode CNE2 may contact another end of each of the light-emitting elements ED and the light-emitting elements ED may emit light in response to an electrical signal received from the voltage lines VL1 and VL2. The light-emitting elements ED may each include a first end at which the first semiconductor layer 31 is disposed and a second end opposite to the first end at which the second semiconductor layer 32 or the electrode layer 37 is disposed. Light-emitting elements ED may be divided into light-emitting elements oriented in opposite directions according to a connection electrode CNE which contacts the first ends. For example, the light-emitting elements ED may include first type light-emitting elements oriented such that the second ends contact the first connection electrode CNE1 and the first ends contact the second connection electrode CNE2 and second type light-emitting elements oriented in a direction opposite to that of the first type light-emitting elements. When the first type light-emitting elements are light-emitting elements oriented in the forward direction, they may emit light in response to an electrical signal received from the voltage lines VL1 and VL2. The second type light-emitting elements may be light-emitting elements oriented in the reverse direction and may not emit light.

The luminous efficiency and manufacturing yield of the display device 10 may increase as the number of forward-oriented light-emitting elements (e.g., the first type light-emitting elements) among the light-emitting elements ED disposed in each subpixel SPXn increases. The light-emitting element ED may have a dipole moment according to charges of a dopant of the first semiconductor layer 31 and the second semiconductor layer 32 and may be subjected to a greater force applied by an electric field as the magnitude of the dipole moment increases. As the force applied by the electric field increases, opposing ends of the light-emitting element ED are more likely to be oriented in an intended direction, and the luminous efficiency and manufacturing yield of the display device 10 may increase.

In the light-emitting element ED, a first length HA of the first semiconductor layer 31 may be greater than each of a second length HB of the second semiconductor layer 32 and a third length Hc of the light emitting layer 36. The proportion of the first length HA of the first semiconductor layer 31 in the total length of the light-emitting element ED may be equal to or greater than about 80%. A high doping concentration index MC of the first semiconductor layer 31 may be an important factor contributing to a large dipole moment of the light-emitting element ED.

According to an embodiment, in the light-emitting element ED, the first semiconductor layer 31 may have a doping concentration index value IDC equal to or greater than a value of an embodiment, and a dipole moment may have a large value. For example, an n-type dopant of the first semiconductor layer 31 may have a doping concentration index value IDC equal to or greater than about $2.5*10^{11}$ atoms/cm, and a number of forward-oriented light-emitting elements may include first ends at which the first semiconductor layer 31 and second ends opposite to the first ends, wherein the first ends contact the second connection electrode CNE2 and the second ends contact the first connection electrode CNE1, and a proportion of the number of forward-oriented light-emitting elements among the light-emitting elements ED disposed in each subpixel SPXn of the display device 10 may be equal to or greater than about 60%. When the first semiconductor layer 31 of the light-emitting element ED has a doping concentration index value IDC equal to or greater than about $2.5*10^{11}$ atoms/cm, the light-emitting element ED may have a dipole moment value that enables it to receive a force of sufficient strength applied by an electric field. More than half of the light-emitting elements ED disposed in each subpixel SPXn or equal to or greater than about 60% of the light-emitting elements ED may be subjected to a force of sufficient strength and thus may be forward-oriented as intended by the electric field.

However, the disclosure is not limited thereto, and the number of forward-oriented light-emitting elements ED may increase as a doping concentration index value IDC of the first semiconductor layer 31 increases. In an embodiment, the doping concentration index value IDC of the first semiconductor layer 31 in the light-emitting element ED may be equal to or greater than about $4*10^{11}$ atoms/cm, and a proportion of forward-oriented light-emitting elements among the light-emitting elements ED disposed in each subpixel SPXn may be equal to or greater than about 80%. As the doping concentration index value IDC of the first semiconductor layer 31 increases, the proportion of forward-oriented light-emitting elements among the light-emitting elements ED may increase, and the luminous efficiency and manufacturing yield of the display device 10 may increase.

In an embodiment, the first semiconductor layer 31 in the light-emitting element ED may have a substantially uniform doping concentration n(x) regardless of position. The doping concentration index IDC may be adjusted according to the doping concentration n(x) and the first length HA of the first semiconductor layer 31. For example, the light-emitting element ED may have a length in a range of about 4 μm to about 6 girl, the first length HA of the first semiconductor layer 31 may be in a range of about 3,500 nm to about 5,000 nm, and the doping concentration n(x) of the n-type dopant may be equal to or greater than about $1*10^{18}$ atoms/cm$^3$ regardless of position. In embodiments, the doping concentration n(x) of the n-type dopant of the first semiconductor layer 31 may be equal to or greater than about $6*10^{18}$ atoms/cm$^3$ regardless of position. For example, the doping concentration index IDC of the first semiconductor layer 31 may be equal to or greater than about $5*10^{11}$ atoms/cm, and the light-emitting element ED may have a large dipole moment.

Since the doping concentration index value IDC of the first semiconductor layer 31 may be a value obtained by integrating the product of the doping concentration n(x) and the distance x from the interface $l_0$ with the light emitting layer 36 to the end 1 opposite the interface, the doping concentration n(x) of the first semiconductor layer 31 may not necessarily be uniform regardless of position. In embodiments, the first semiconductor layer 31 may include regions with different doping concentrations n(x) to have a doping concentration profile according to a doped region. The sum of the doping concentration index value IDC calculated in each region may be equal to or greater than about $2.5*10^{11}$ atoms/cm. Even if the light-emitting element ED includes regions with different doping concentrations, it may have a large dipole moment because it has a doping concentration index value IDC equal to or greater than a value of an embodiment, and the luminous efficiency and manufacturing yield of the display device 10 may increase because the proportion of forward-oriented light-emitting elements ED increases.

A process of manufacturing the display device 10 according to the embodiment will now be described with reference to other drawings.

FIGS. 7 through 15 are schematic cross-sectional views illustrating a process of manufacturing light-emitting elements ED according to an embodiment. FIGS. 7 through 15 sequentially illustrate the process of manufacturing the light-emitting elements ED.

Figure 7:
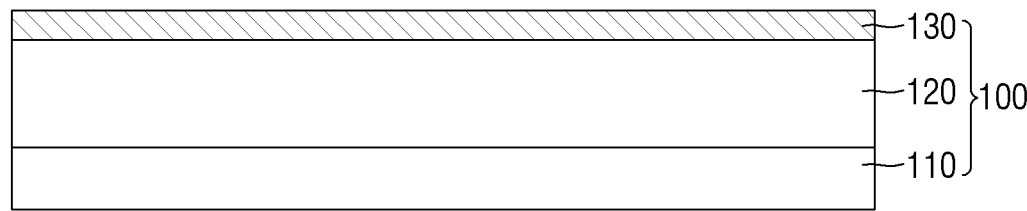
FIGS. 7 through 15 are schematic cross-sectional views illustrating a process of manufacturing light-emitting elements according to an embodiment.

Referring to FIG. 7, a target substrate 100 including a base substrate 110, a buffer material layer 120 disposed on the base substrate 110, and a sub-semiconductor layer 130 disposed on the buffer material layer 120 is prepared. The base substrate 110 may include a sapphire substrate (Al$_2$O$_3$) or a transparent substrate such as glass. However, the disclosure is not limited thereto, and the base substrate 110 may also be made of a conductive substrate such as GaN, SiC, ZnO, Si, GaP, or GaAs. A thickness of the base substrate 110 is not particularly limited but may be, for example, in a range of about 400 μm to about 1,500 μm.

Semiconductor layers are formed on the base substrate 110. The semiconductor layers grown by an epitaxial method may be formed by growing seed crystals. A method of forming the semiconductor layers may include electron beam deposition, physical vapor deposition (PVD), chemical vapor deposition (CVD), plasma laser deposition (PLD), dual-type thermal evaporation, sputtering, or metal organic chemical vapor deposition (MOCVD), but the disclosure is not limited thereto. For example, in an embodiment, a method of forming the semiconductor layer may include MOCVD.

A precursor material for forming the semiconductor layers is not particularly limited within a range of materials that can be generally selected to form a target material. For example, the precursor material may include a metal precursor including an alkyl group such as a methyl group or an ethyl group. For example, in an embodiment in which a first semiconductor layer 31, a second semiconductor layer 32, and a light emitting layer 36 include any one of AlGaInN, GaN, AlGaN, InGaN, AlN or InN as in the light-emitting element ED according to the embodiment, the metal precursor may be trimethyl gallium (Ga(CH$_3$)$_3$) or may be a compound such as trimethyl aluminum (Al(CH$_3$)$_3$) or triethyl phosphate (C$_2$H$_5$)$_3$PO$_4$. However, the disclosure is not limited thereto. The semiconductor layers may be formed through a deposition process using the metal precursor and a non-metal precursor. A method and process conditions for forming the semiconductor layers will not be described below, and the method of manufacturing the light-emitting elements ED and the structure of each light-emitting element ED will be described in detail.

The buffer material layer 120 and the sub-semiconductor layer 130 are formed on the base substrate 110. The buffer material layer 120 and the sub-semiconductor layer 130 may reduce a difference in lattice constant between a first semiconductor material layer 310 formed thereon and the base substrate 110.

For example, the buffer material layer 120 may include an undoped semiconductor, and the sub-semiconductor layer 130 may include a lightly doped semiconductor. The buffer material layer 120 and the sub-semiconductor layer 130 may include a substantially same material as the first semiconductor material layer 310 but may include a material not doped with an n type or a p type or may have a doping concentration less than that of the first semiconductor material layer 310. In an embodiment, the buffer material layer 120 and the sub-semiconductor layer 130 may be, but are not limited to, at least any one of InAlGaN, GaN, AlGaN, InGaN, AlN, and InN.

Figure 8:
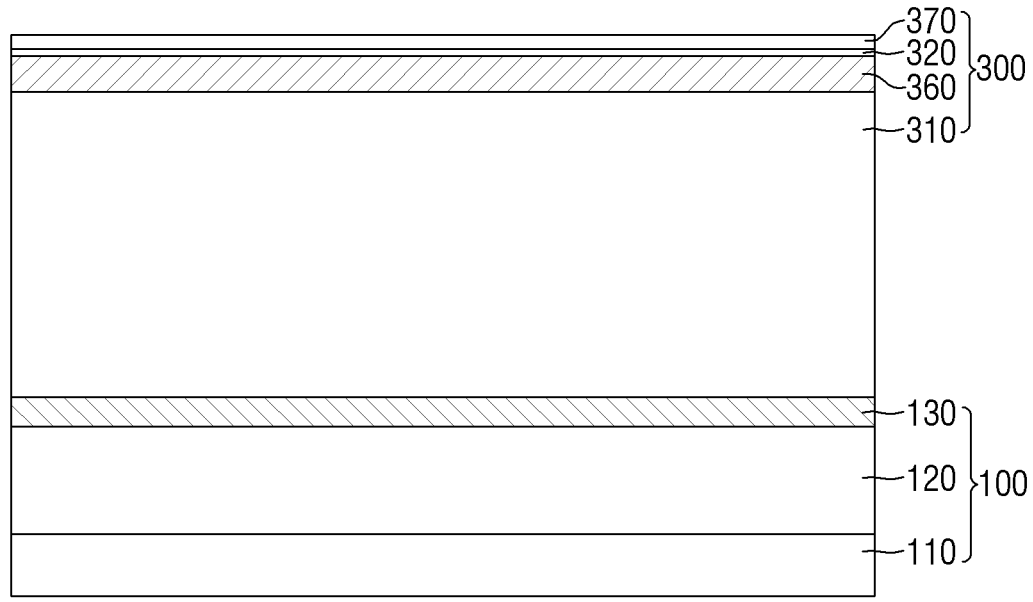

Referring to FIG. 8, a semiconductor structure 300 is formed on the target substrate 100. The semiconductor structure 300 may include the first semiconductor material layer 310, a light emitting material layer 360, a second semiconductor material layer 320, and an electrode material layer 370. Layers included in the semiconductor structure 300 may respectively correspond to layers included in the light-emitting element ED according to an embodiment. For example, these layers may include the same materials as the first semiconductor layer 31, the light emitting layer 36, the second semiconductor layer 32, and the electrode layer 37 of the light-emitting element ED, respectively.

The doping concentration of the first semiconductor material layer 310 may be adjusted by adjusting the amount of dopant implanted in a process of forming the first semiconductor material layer 310. As described above, the doping concentration of the first semiconductor material layer 310 may be adjusted so that the first semiconductor layer 31 of each light-emitting element ED has a doping concentration index IDC equal to or greater than a value of an embodiment.

In an embodiment, in the semiconductor structure 300, the first semiconductor material layer 310 may have a substantially uniform doping concentration n(x) regardless of position, the first semiconductor material layer 310 may have a length in a range of about 3,500 nm to 5,000 nm, and the doping concentration n(x) of an n-type dopant may be equal to or greater than about $1*10^{18}$ atoms/cm$^3$ regardless of position. In embodiments, the doping concentration n(x) of the first semiconductor material layer 310 may be equal to or greater than about $6*10^{18}$ or more regardless of position. The doping concentration index IDC of the first semiconductor layer 31 in each light-emitting element ED manufactured in a subsequent process may be equal to or greater than about $5*10^{11}$ atoms/cm, and the light-emitting elements ED may have a large dipole moment.

Referring to FIGS. 9 through 12, semiconductor rods SR spaced apart from each other are formed by etching the semiconductor structure 300. According to an embodiment, the etching of the semiconductor structure 300 may include forming a mask layer 400 and mask patterns 500 on the semiconductor structure 300, performing a first etching process of etching the mask layer 400 along the mask patterns 500, and performing a second etching process of etching the semiconductor structure 300 along the etched mask layer 400.

Figure 9:
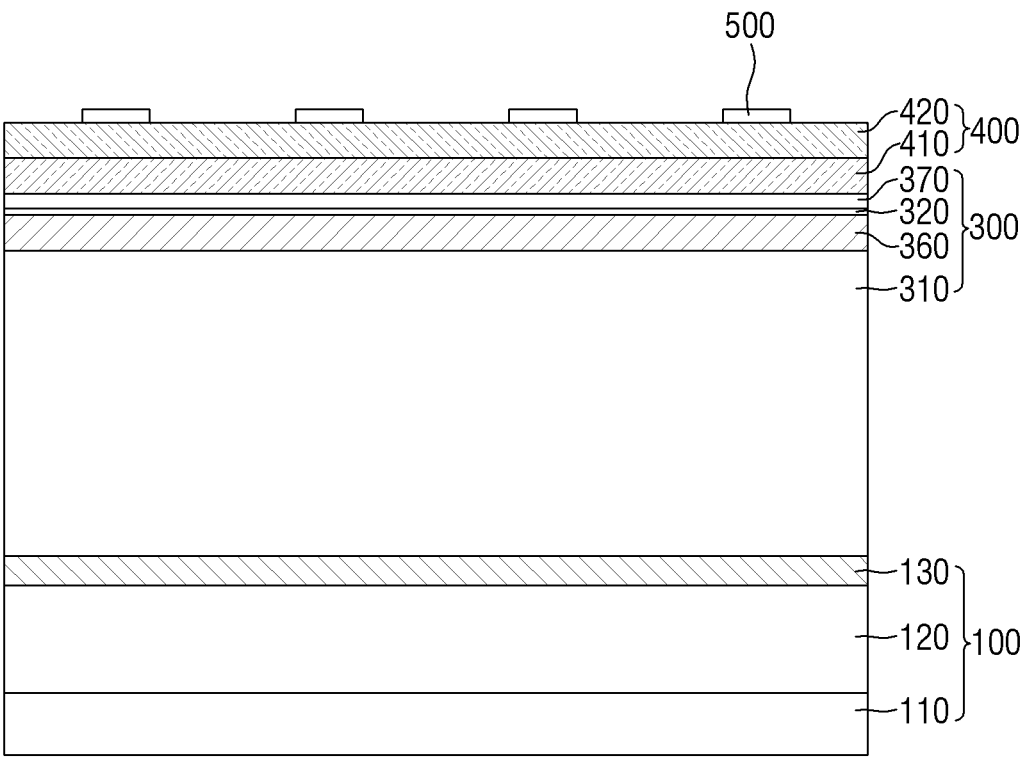

As illustrated in FIG. 9, the mask layer 400 and the mask patterns 500 are formed on the semiconductor structure 300. The mask layer 400 may include a first insulating mask layer 410 disposed on the electrode material layer 370 and a second insulating mask layer 420 disposed on the first insulating mask layer 410, and the mask patterns 500 spaced apart from each other may be disposed on the second insulating mask layer 420. The insulating mask layers 410 and 420 may be etched along a space between the mask patterns 500, and the semiconductor structure 300 may be etched along a space between parts of the etched insulating mask layers 410 and 420. In embodiments, the mask patterns 500 may have a same diameter or width. Since parts of the semiconductor structure 300 on which the mask patterns 500 are disposed and parts of the semiconductor structure 300 on which the mask patterns 500 are not disposed form the semiconductor rods SR, a diameter of the mask patterns 500 may be substantially same as a diameter of the light-emitting elements ED. Since the mask patterns 500 have a same diameter or width, the light-emitting elements ED may also have substantially a same diameter.

The first insulating mask layer 410 and the second insulating mask layer 420 may each include an insulating material, and the mask patterns 500 may include a metal material. For example, each of the insulating mask layers 410 and 420 may include silicon oxide ($SiO_x$), silicon nitride ($SiN_x$), or silicon oxynitride ($SiO_xN_y$). The mask patterns 500 may include a metal such as, but not limited to, chromium (Cr).

Figure 10:
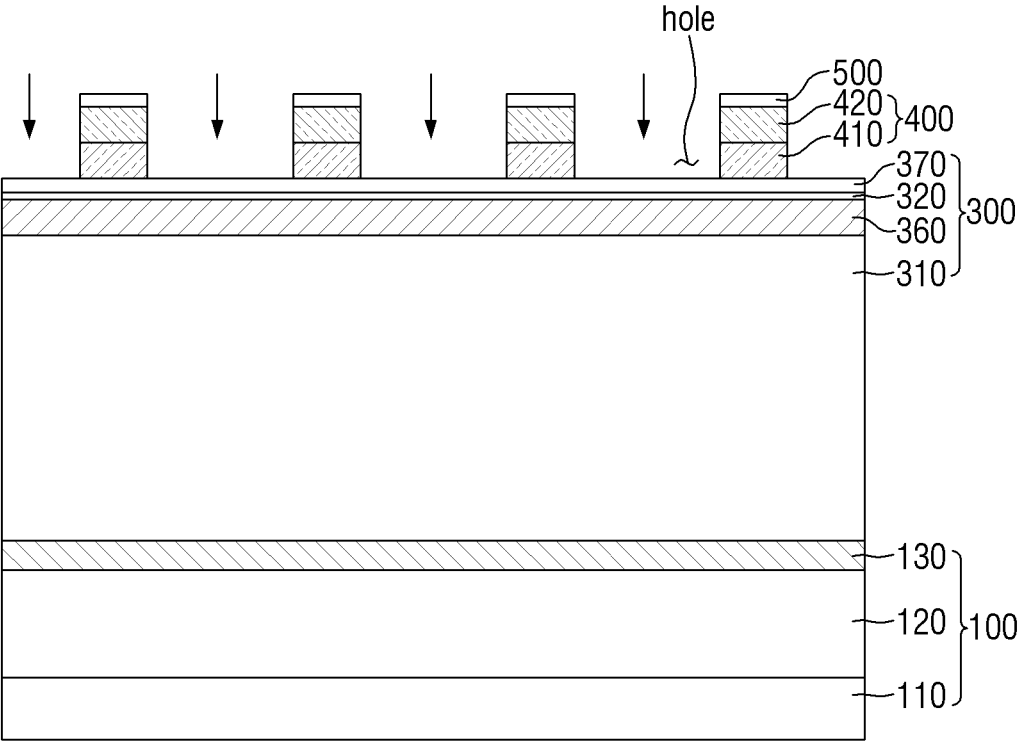
Figure 11:
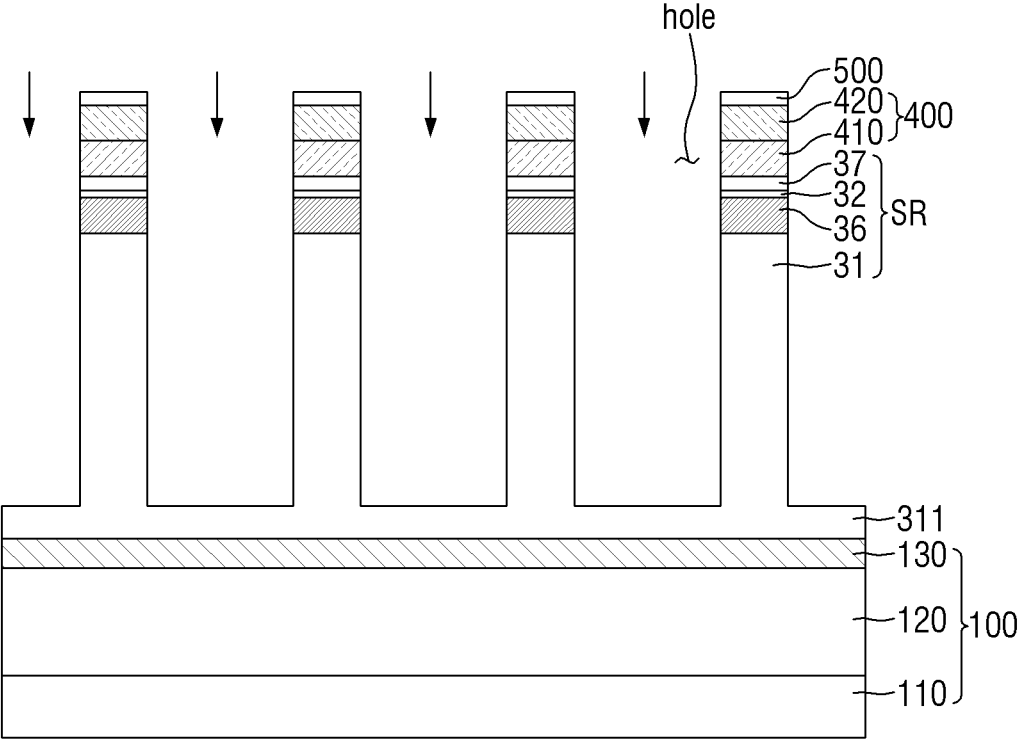
Figure 12:
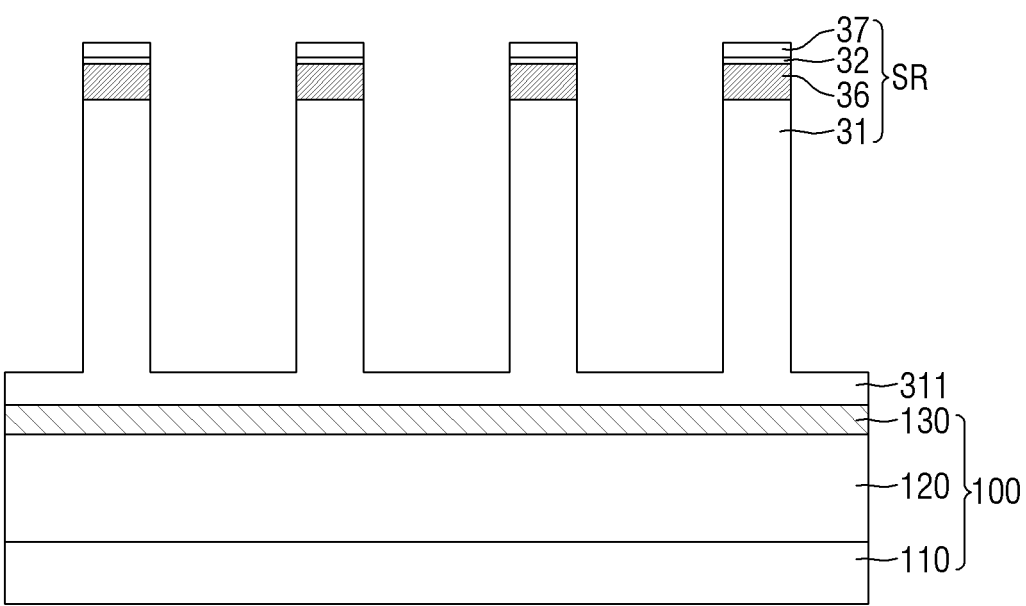

As illustrated in FIGS. 10 through 12, a first etching process of etching the mask layer 400 along the mask patterns 500 and a second etching process of etching the semiconductor structure 300 along the etched mask layer 400 in a direction perpendicular to an upper surface of the target substrate 100 are performed.

Each of the above etching processes may be dry etching, wet etching, reactive ion etching (RIE), inductively coupled plasma reactive ion etching (ICP-RIE), or the like. Dry etching may be suitable for vertical etching because anisotropic etching is possible. When the above etching methods are used, an etchant may be, but is not limited to, $Cl_2$ or $O_2$.

The mask layer 400 may be etched in the first etching process to form holes, and the semiconductor structure 300 may be etched along the holes in the second etching process to form semiconductor rods SR. In an embodiment, the first etching process and the second etching process may be, but are not limited to, a dry etching process and a wet etching process, respectively. In embodiments, the mask layer 400 and the semiconductor structure 300 may be etched along the mask patterns 500 by a continuous etching process.

The layers of the semiconductor structure 300 may be formed into the semiconductor rods SR, each including the first semiconductor layer 31, the light emitting layer 36, the second semiconductor layer 32 and the electrode layer 37, by an etching process, and the semiconductor rods SR may be spaced apart from each other with a hole interposed between them. In the etching process, the first semiconductor material layer 310 may not be completely etched, but a lower part of the first semiconductor material layer 310 may remain as a residual semiconductor layer 311, and an upper surface of the residual semiconductor layer 311 may be partially exposed in the holes.

Figure 13:
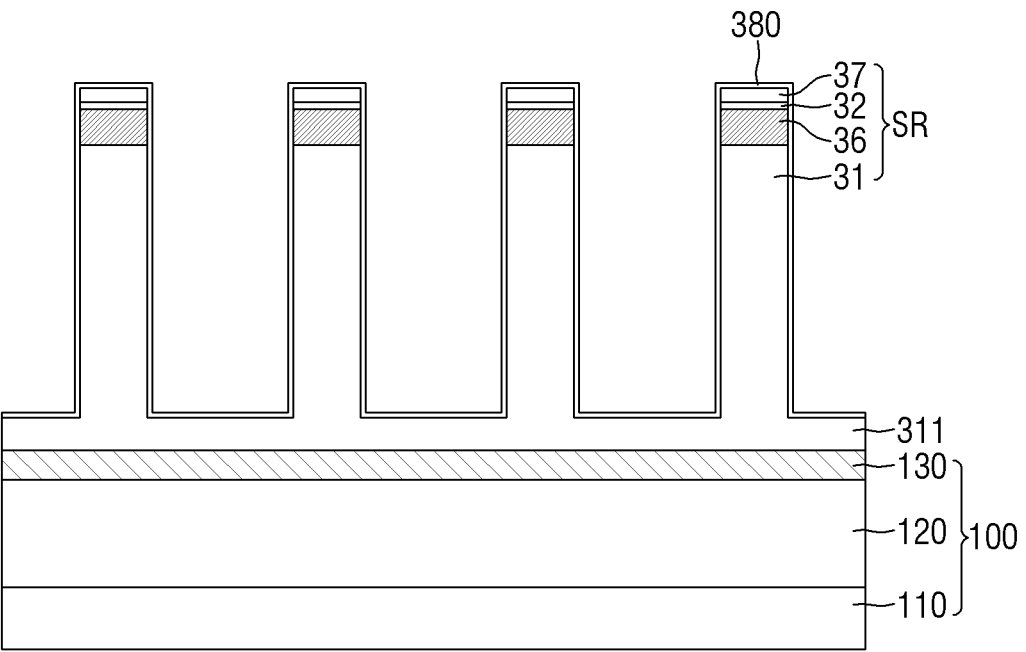
Figure 14:
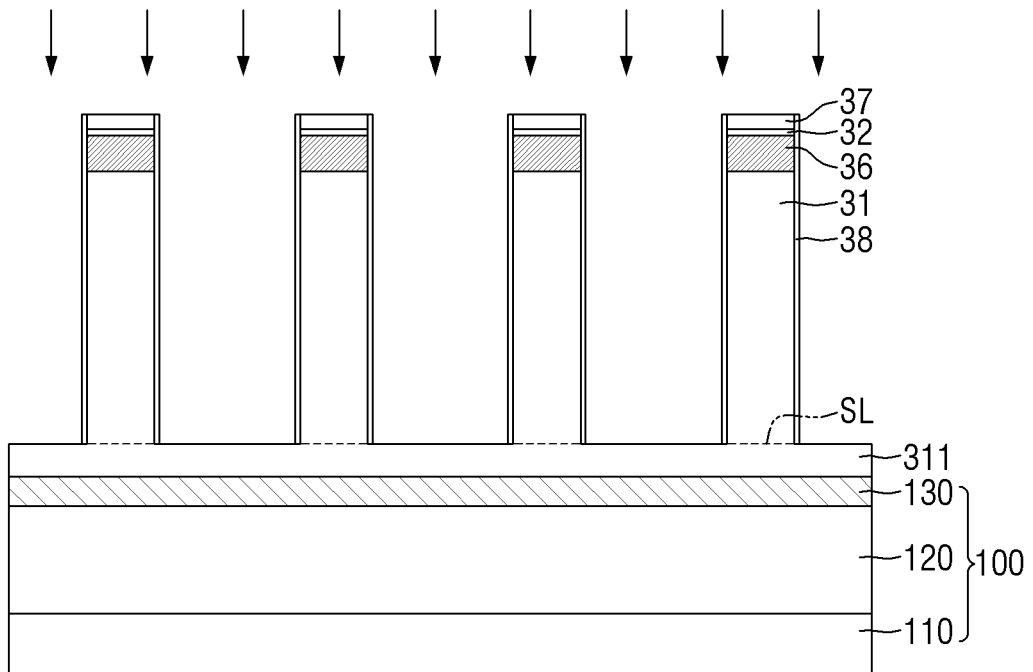

Referring to FIGS. 13 and 14, an insulating film 38 is formed to partially surround side surfaces of each of the semiconductor rods SR. The insulating films 38 may be formed by performing a third etching process of forming an insulating film 380 on outer surfaces of the semiconductor rods SR and partially removing the insulating film 380 to expose upper surfaces of the semiconductor rods SR.

The insulating film 380 may be an insulating material formed on the outer surfaces of the semiconductor rods SR and may be formed by applying an insulating material on the outer surfaces of the vertically etched semiconductor rods SR or using an immersion method. However, the disclosure is not limited thereto. For example, the insulating film 380 may be formed by atomic layer deposition (ALD) or CVD.

The insulating film 380 may be formed not only on the side surfaces and upper surfaces of the semiconductor rods SR but also on the residual semiconductor layer 311 exposed between the semiconductor rods SR spaced apart from each other. The insulating film 380 may be partially removed by a process such as dry etching, which is anisotropic etching, or etch-back. In the drawings, an upper surface of the insulating film 380 is removed to expose the electrode layers 37, and the electrode layers 37 may also be partially removed in this process. For example, a thickness of the electrode layer 37 of each light-emitting element 30 finally manufactured may be less than a thickness of the electrode material layer 370 formed during the process of manufacturing the light-emitting elements ED.

In the drawings, upper surfaces of the electrode layers 37 are partially exposed, and upper surfaces of the insulating films 38 are flat, but the disclosure is not limited thereto. In embodiments, an outer surface of each of the insulating films 38 may be partially curved in an area surrounding an electrode layer 37. In the process of partially removing the insulating film 380, not only the upper surface but also side surfaces of the insulating film 380 may be partially removed. Therefore, an end surface of each insulating film 38 surrounding layers may be partially etched. For example, since the upper surface of the insulating film 380 is removed, the outer surface of the insulating film 38 adjacent to the electrode layer 37 in each light-emitting element 30 may be partially removed.

Figure 15:
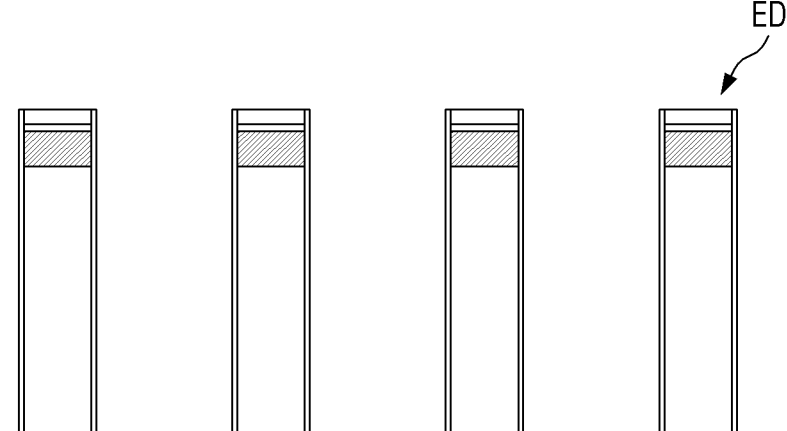
Figure 15:
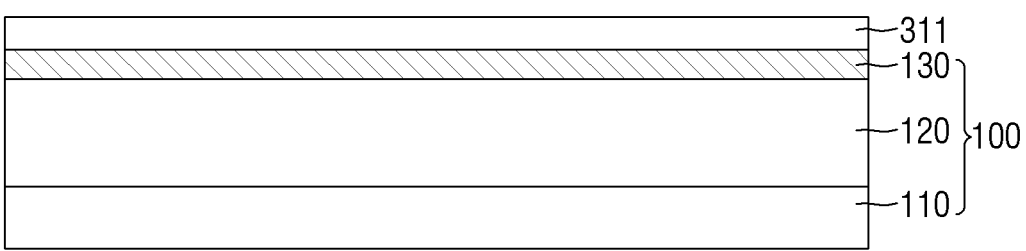

As illustrated in FIG. 15, the semiconductor rods SR on which the insulating films 38 are formed are separated from the residual semiconductor layer 311 to manufacture the light-emitting elements ED. The semiconductor rods SR may be separated along a separation surface SL of a part where lower ends of the first semiconductor layers 31 are connected to the residual semiconductor layer 311. The separation surface SL may be parallel to the upper surface of the residual semiconductor layer 311 exposed in the holes. The first semiconductor layers 31 of the light-emitting elements ED finally manufactured may be shorter in length than the first semiconductor material layer 310 of the semiconductor structure 300. The doping concentration index IDC of each of the first semiconductor layers 31 may vary according to the distance from an interface with a light emitting layer 36 to an end surface opposite the interface. The doping concentration of a dopant and the length of the first semiconductor material layer 310 may be adjusted in consideration of the doping concentration index value IDC of the first semiconductor layer 31 in each light-emitting element ED manufactured.

Hereinafter, embodiments of the display device 10 will be described with reference to other drawings.

Figure 16:
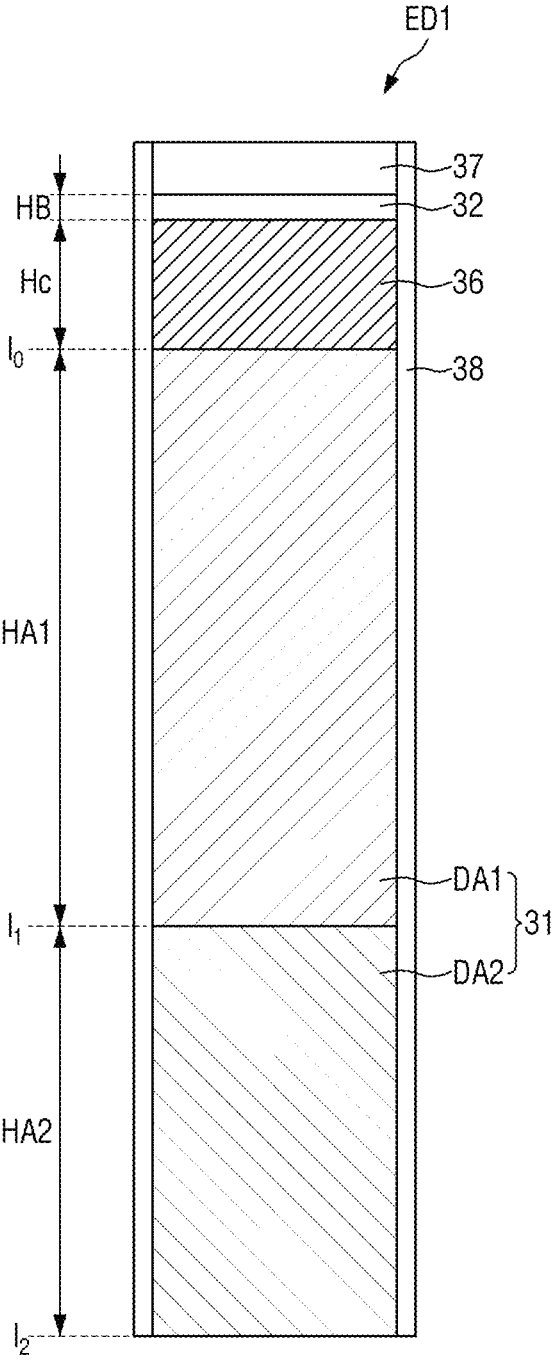
FIGS. 16 and 17 are each a schematic cross-sectional view light-emitting elements according to embodiments.
Figure 17:
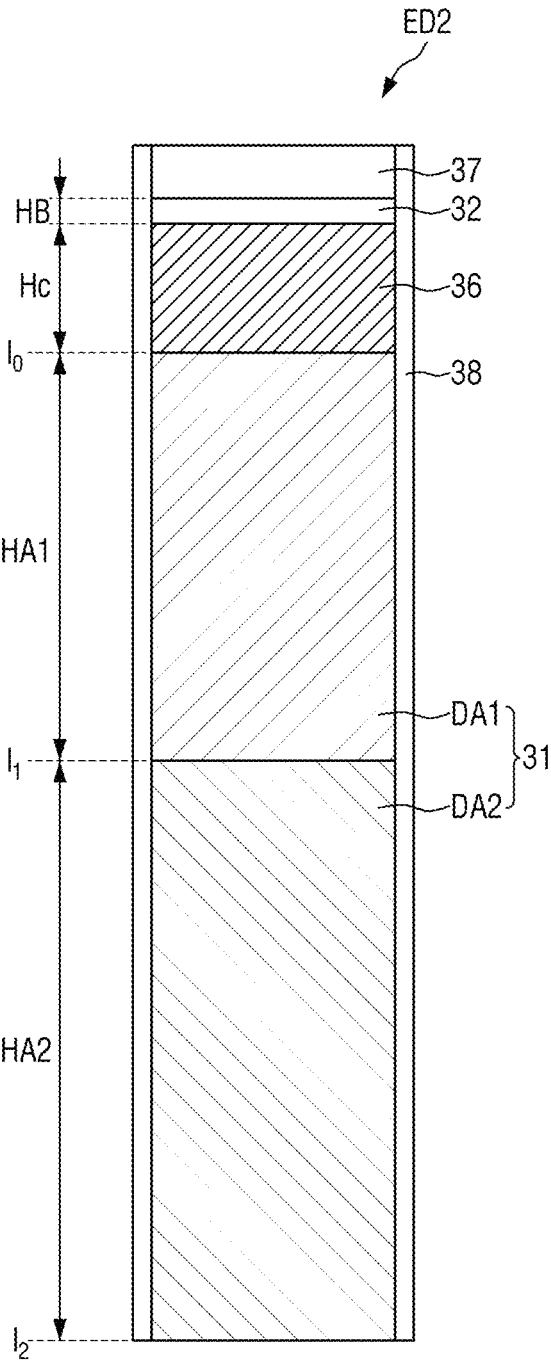

FIGS. 16 and 17 are each a schematic cross-sectional view of light-emitting elements ED1 and ED2 according to embodiments.

Referring to FIG. 16, in each of the light-emitting elements ED1 and ED2 according to embodiments, a first semiconductor layer 31 may include doped regions DA1 and DA2 having different doping concentrations n(x). The first semiconductor layer 31 may include a first doped region DA1 and a second doped region DA2, and the first doped region DA1 may have a doping concentration of an n-type dopant different from a doping concentration of an n-type dopant of the second doped region DA2. The first doped region DA1 may contact a light emitting layer 36, and the second doped region DA2 may contact the first doped region DAL.

The first doped region DA1 and the second doped region DA2 may be different from each other in the doping concentration n(x) of the n-type dopant, and the doping concentration n(x) of the first semiconductor layer 31 may have a profile that changes according to a distance x from a first interface $l_0$ between the light emitting layer 36 and the first doped region DAL. The doping concentration n(x) from the first interface $l_0$ to a second interface $l_1$ between the first doped region DA1 and the second doped region DA2 may be the doping concentration of the n-type dopant of the first doped region DA1, and the doping concentration n(x) from the second interface $l_1$ to an end surface $l_2$ of the first semiconductor layer 31 opposite the first interface $l_0$ may be the doping concentration of the n-type dopant of the second doped region DA2.

Accordingly, a doping concentration index IDC of the first semiconductor layer 31 may be defined as the sum of a doping concentration index value of the first doped region DA1 and a doping concentration index value of the second doped region DA2. For example, the doping concentration index IDC of the first semiconductor layer 31 may be the sum of a doping concentration index value from the first interface $l_0$ to the second interface $l_1$ and a doping concentration index value from the second interface Ii to the end surface $l_2$ of the first semiconductor layer 31. The doping concentration index between the first interface $l_0$ and the second interface $l_1$ may be an integral value of the doping concentration n(x) of the first doped region DA1 according to the distance x, and the doping concentration index value between the second interface $l_1$ and the end surface $l_2$ of the first semiconductor layer 31 may be an integral value of the doping concentration n(x) of the second doped region DA2 according to the distance x. The doping concentration index IDC of the first semiconductor layer 31 may be expressed as in Equation 2:

$$IDC \text{ (Index of doping concentration)} = \qquad \text{[Equation 2]}$$

-continued
$$\int_{l0}^{l1} n1(x)xdx + \int_{l1}^{l2} n2(x)xdx$$

In Equation 2, $l_0$ may be the position of an interface between the first doped region DA1 of the first semiconductor layer 31 and the light emitting layer 36, $l_1$ may be the position of an interface between the first doped region DA1 and the second doped region DA2, $l_2$ may be the position of an end surface of the first semiconductor layer 31 which is opposite the interface between the second doped region DA2 and the light emitting layer 36, x may be a distance from $l_0$ to $l_2$, $n_1(x)$ may be the doping concentration of a dopant according to an x value of the first doped region DA1, and $n_2(x)$ may be the doping concentration of the dopant according to the x value of the second doped region DA2.

Since the first semiconductor layer 31 includes the first doped region DA1 and the second doped region DA2, the doping concentration index IDC of the first semiconductor layer 31 may vary according to a doping concentration profile and a length of each of the doped regions DA1 and DA2. Lengths HA1 and HA2 of the first doped region DA1 and the second doped region DA2 may be adjusted according to doping concentrations of the doped regions DA1 and DA2, respectively. The first doped region DA1 and the second doped region DA2 may have different lengths HA1 and HA2, respectively. For example, as in the embodiment of FIG. 16, the length HA1 of the first doped region DA1 may be greater than the length HA2 of the second doped region DA2. For example, the length HA1 of the first doped region DA1 may be in a range of about 2,000 nm to about 2 500 nm, and the length HA2 of the second doped region DA2 may be in a range of about 1,500 nm to about 2,300 nm.

However, the disclosure is not limited thereto, and the length HA1 of the first doped region DA1 may be less than the length HA2 of the second doped region DA2, as in the embodiment of FIG. 17. For example, the length HA1 of the first doped region DA1 may be in a range of about 1,500 nm to about 2,300 nm, and the length HA2 of the second doped region DA2 may be in a range of about 2,000 nm to about 2,500 nm. Even if the first doped region DA1 and the second doped region DA2 have relatively small lengths HA1 and HA2, each of the lengths HA1 and HA2 of the first doped region DA1 and the second doped region DA2 may be greater than a length HB of a second semiconductor layer 32, a length Hc of the light emitting layer 36, and a length of an electrode layer 37.

In an embodiment in which the first doped region DA1 is smaller than the second doped region DA2, since the proportion of the second doped region DA2, which has a high doping concentration, in the first semiconductor layer 31 is smaller in the light-emitting element ED1 of FIG. 16 than in the light-emitting element ED2 of FIG. 17, a doping concentration index value IDC of the first semiconductor layer 31 may also be less than a doping concentration index value IDC of the first semiconductor layer 31 in the light-emitting element ED1 of FIG. 16. However, each of the light-emitting elements ED1 and ED2 may have a doping concentration n(x) that enables the doping concentration index value IDC of the first semiconductor layer 31 to have a value greater than about $2.5*10^{11}$ atoms/cm regardless of the lengths HA1 and HA2 of the doped regions DA1 and DA2.

The light-emitting elements ED1 and ED2 of FIGS. 16 and 17 may be manufactured by adjusting the dopant content in a process of forming a first semiconductor material layer
310 during a manufacturing process.

Figure 18:
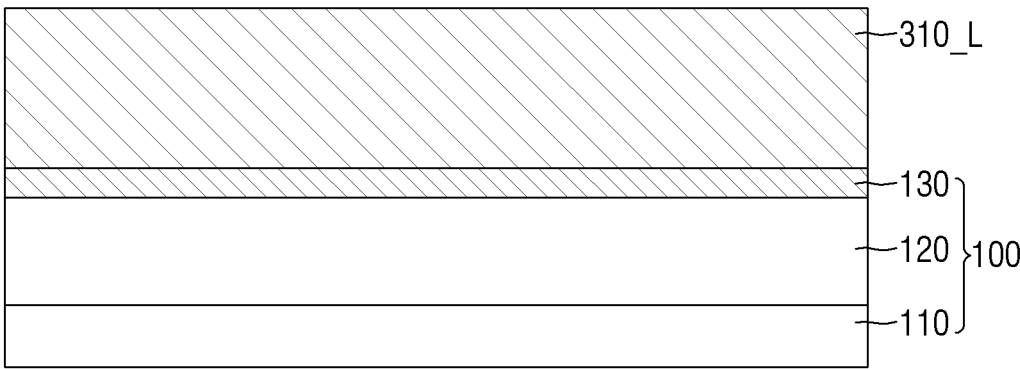
FIGS. 18 and 19 are schematic cross-sectional views illustrating a part of a process of manufacturing the light-emitting element of FIG. 16.
Figure 19:
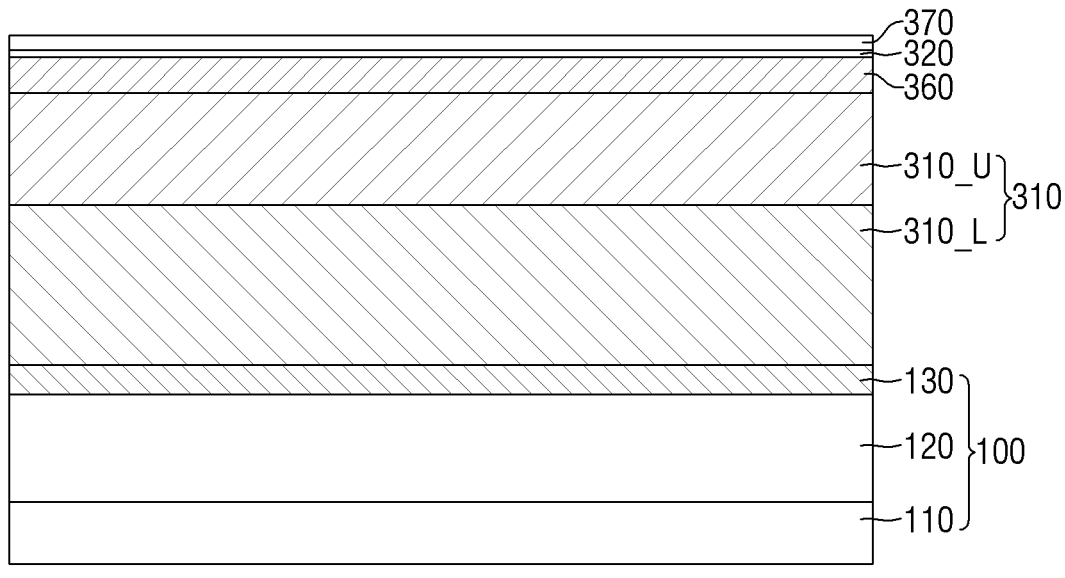

FIGS. 18 and 19 are schematic cross-sectional views
illustrating a part of a process of manufacturing the light-
emitting element ED1 of FIG. 16.

Referring to FIGS. 18 and 19, in the process of forming
the first semiconductor material layer 310 on a sub-semi-
conductor layer 130, a base layer 310_L of the first semi-
conductor material layer 310 may be formed first, and an
upper layer 310_U may be formed by adjusting the content
of a dopant implanted. The first semiconductor material
layer 310 may include the upper layer 310_U and the base
layer 310_L having different dopant concentrations, and the
upper layer 310_U and the base layer 310_L may form the
first doped region DA1 and the second doped region DA2 of
the light-emitting element ED1 or ED2, respectively.

According to an embodiment, in the light-emitting ele-
ment ED1 or ED2, the first semiconductor layer 31 may
include the doped regions DA1 and DA2 having different
doping concentrations and thus have a doping concentration
profile according to position. However, the doping concen-
tration of each of the doped regions DA1 and DA2 may be
adjusted so that the doping concentration index IDC of the
first semiconductor layer 31 has a value equal to or greater
than a value of an embodiment. Since the display device 10
includes the light-emitting element ED1 or ED2 having
doped regions DA1 and DA2, the proportion of forward-
oriented light-emitting elements ED may increase, and the
luminous efficiency and manufacturing yield may be
improved.

According to an embodiment, in a semiconductor struc-
ture 300, the doping concentration of the n-type dopant of
the upper layer 310_U of the first semiconductor material
layer 310 or the first doped region DA1 may be equal to or
greater than about $7*10^{18}$ atoms/cm$^3$, and the doping con-
centration of the n-type dopant of the base layer 310_L of the
first semiconductor material layer 310 or the second doped
region DA2 may be equal to or greater than about $8*10^{18}$
atoms/cm$^3$. The first doped region DA1 or the upper layer
310_U may have a length in a range of about 2,000 nm to
about 2,500 nm, and the second doped region DA2 or the
base layer 310_L may have a length in a range of about
1,500 nm to about 2,300 nm, and vice versa. When each of
the layers 310_U and 310_L of the first semiconductor
material layer 310 has the doping concentration n(x) and the
length HA1 or HA2 described above, a doping concentration
index IDC of the first semiconductor layer 31 in the light-
emitting element ED1 or ED2 manufactured from the semi-
conductor structure 300 may be equal to or greater than
about $2.5*10^{11}$ atoms/cm.

The first semiconductor layer 31 may also include a larger
number of doped regions and may have more doping con-
centration profiles according to a position.

Figure 20:
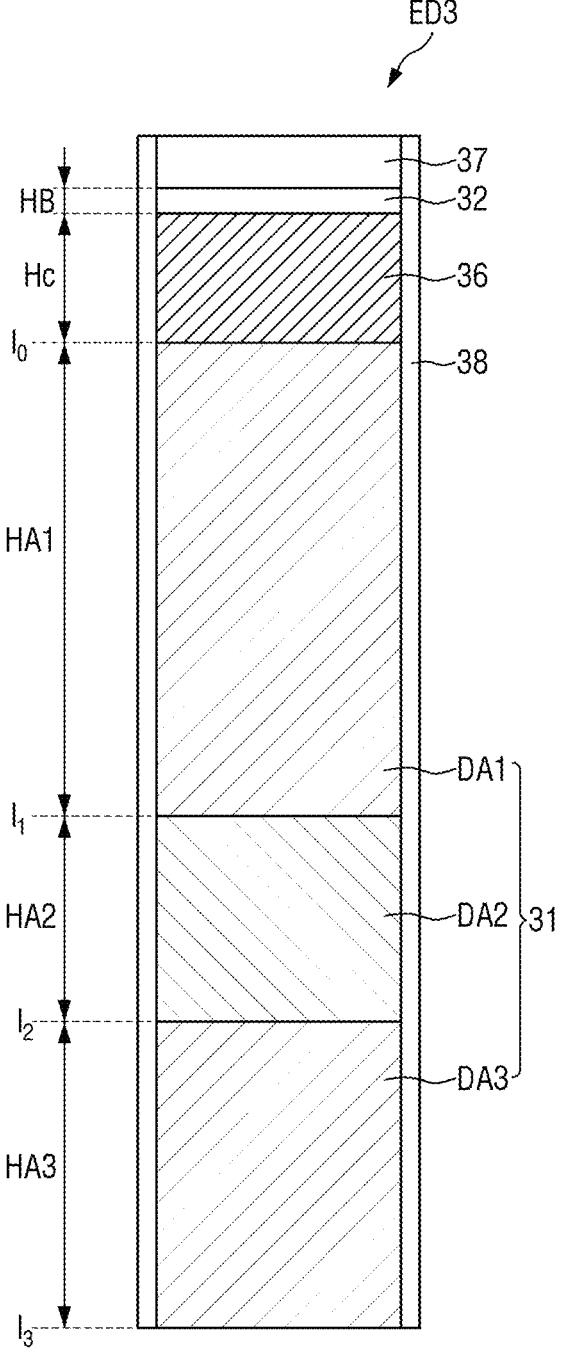
FIGS. 20 and 21 are each a schematic cross-sectional view of light-emitting elements according to embodiments.
Figure 21:
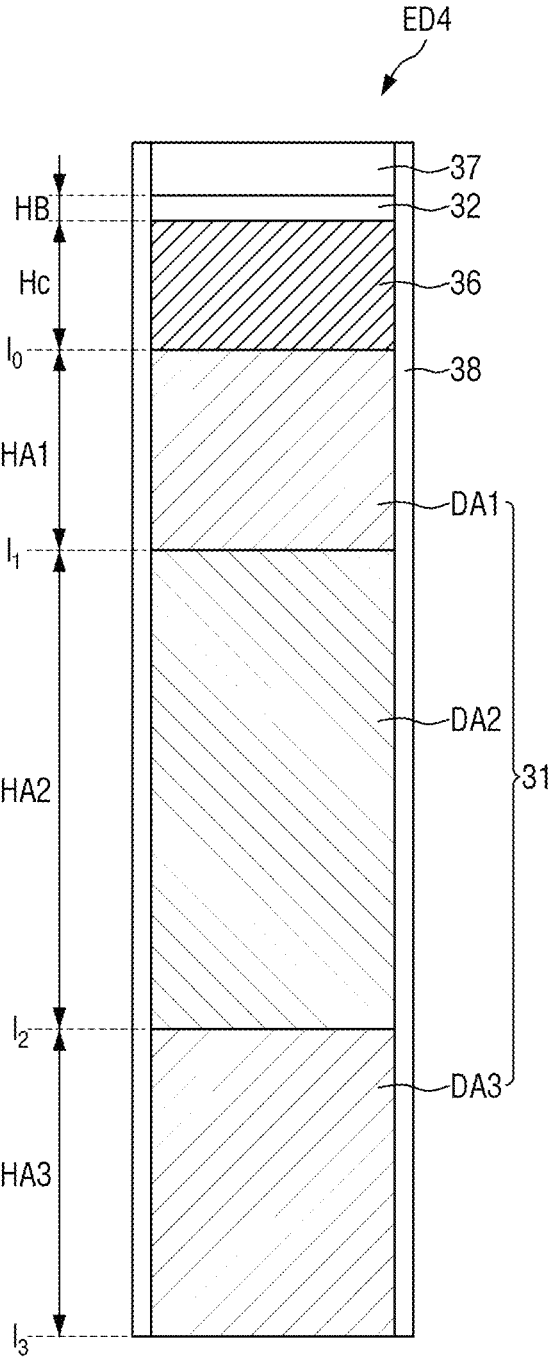

FIGS. 20 and 21 are each a schematic cross-sectional
view of light-emitting elements ED3 and ED4 according to
embodiments.

Referring to FIGS. 20 and 21, in each of the light-emitting
elements ED3 and ED4 according to embodiments, a first
semiconductor layer 31 may include doped regions DA1
through DA3. The first semiconductor layer 31 may include
a first doped region DA1 that contacts a light emitting layer
36, a second doped region DA2 that contacts the first doped
region DA1 and having a doping concentration of an n-type
dopant different from a doping concentration of an n-type
dopant of the first doped region DA1, and a third doped
region DA3 that contacts the second doped region DA2 and
having a doping concentration of the n-type dopant different from a doping concentration of an n-type dopant of the
second doped region DA2. In the first semiconductor layer
31, the first doped region DA1, the second doped region
DA2, and the third doped region DA3 may be sequentially
disposed from the light emitting layer 36 to an end surface.

The doped regions DA1 through DA3 may have different
doping concentrations n(x), and the doping concentration
n(x) of the first semiconductor layer 31 may have a profile
that changes according to a distance x from a first interface
$l_0$ between the light emitting layer 36 and the first doped
region DA1. The doping concentration n(x) from the first
interface $l_0$ to a second interface $l_1$ between the first doped
region DA1 and the second doped region DA2 may be the
doping concentration of the n-type dopant of the first doped
region DA1, the doping concentration n(x) from the second
interface Ii to a third interface $l_2$ between the second doped
region DA2 and the third doped region DA3 may be the
doping concentration of the n-type dopant of the second
doped region DA2, and the doping concentration n(x) from
the third interface $l_2$ to an end surface $l_3$ of the first semi-
conductor layer 31 may be the doping concentration of the
n-type dopant of the third doped region DA3. Accordingly,
a doping concentration index IDC of the first semiconductor
layer 31 may be defined as the sum of a doping concentra-
tion index value of the first doped region DA1, a doping
concentration index value of the second doped region DA2,
and a doping concentration index value of the third doped
region DA3. The doping concentration index IDC of the first
semiconductor layer 31 may be expressed as in Equation 3
below:

$$IDC \text{ (Index of doping concentration)} = \text{[Equation 3]}$$
$$\int_{l0}^{l1} n1(x)xdx + \int_{l1}^{l2} n2(x)xdx + \int_{l2}^{l3} n3(x)xdx$$

In Equation 3, $l_0$ may be the position of an interface
between the first doped region DA1 of the first semicon-
ductor layer 31 and the light emitting layer 36, $l_1$ may be the
position of an interface between the first doped region DA1
and the second doped region DA2, $l_2$ may be the position of
an interface between the second doped region DA2 and the
third doped region DA3, $l_3$ may be the position of an end
surface of the first semiconductor layer 31 which is opposite
the interface between the third doped region DA3 and the
light emitting layer 36, x may be a distance from $l_0$ to $l_3$,
$n_1(x)$ may be the doping concentration of a dopant according
to an x value of the first doped region DA1, $n_2(x)$ may be the
doping concentration of the dopant according to the x value
of the second doped region DA2, and $n_3(x)$ may be the
doping concentration of the dopant according to the x value
of the third doped region DA3.

Since the first semiconductor layer 31 includes a larger
number of doped regions DA1 through DA3, the doping
concentration index IDC of the first semiconductor layer 31
may vary according to a doping concentration profile and a
length of each of the doped regions DA1 through DA3.
Lengths HA1 through HA3 of the first through third doped
regions DA1 through DA3 may be adjusted according to
doping concentrations of the doped regions DA1 through
DA3, respectively. For example, as in the embodiment of
FIG. 20, a length HA1 of the first doped region DA1 may be
greater than each of a length HA2 of the second doped
region DA2 and a length HA3 of the third doped region
DA3, and a length HA2 of the second doped region DA2 may be less than a length HA3 of the third doped region DA3. However, the disclosure is not limited thereto, and a length HA1 of the first doped region DA1 may be less than each of a length HA2 of the second doped region DA2 and a length HA3 of the third doped region DA3, and a length HA2 of the second doped region DA2 may be greater than a length HA3 of the third doped region DA3, as in the embodiment of FIG. 21. However, a length of a shortest doped region among the doped regions DA1 through DA3 may be greater than at least a length HB of a second semiconductor layer 32, a length Hc of the light emitting layer 36, and a length of an electrode layer 37.

The relationship between magnitudes of dopant concentration of the doped regions DA1 through DA3 may vary according to a length relationship between the doped regions DA1 through DA3. When the length HA1 of the first doped region DA1 is the largest as in the embodiment of FIG. 20, the doping concentration of the first doped region DA1 may be greater than each of the doping concentration of the second doped region DA2 and the doping concentration of the third doped region DA3, and the doping concentration of the second doped region DA2 may be greater than the doping concentration of the third doped region DA3. For example, the first semiconductor layer 31 may have a doping concentration profile in which the doping concentration n(x) decreases from the first interface $l_0$ with the light emitting layer 36 toward the end surface $l_3$. However, the first semiconductor layer 31 may have the same doping concentration regardless of position within the same doped region DA1, DA2 or DA3.

Similar to what has been described above with reference to other drawings, the light-emitting element ED3 according to the current embodiment may also be manufactured by adjusting a doping concentration profile of a first semiconductor material layer 310 of a semiconductor structure 300. The light-emitting element ED3 may be manufactured through the semiconductor structure 300 in which each layer of the first semiconductor material layer 310 is adjusted to have a different doping concentration and length.

In embodiments, in the semiconductor structure 300, the doping concentration of the n-type dopant may be equal to or greater than about $6*10^{18}$ atoms/cm³ in a first doped region of the first semiconductor material layer 310 and may be equal to or less than about $6*10^{18}$ atoms/cm³ in a second doped region and in a third doped region. The first semiconductor material layer 310 may also have different doped regions DA1 through DA3, like the first semiconductor layer 31 of the light-emitting element ED3, and the doped regions of the first semiconductor material layer 310 may correspond to the doped regions DA1 through DA3 of the light-emitting element, respectively.

According to an embodiment, in the first semiconductor layer 31 of the light-emitting element ED3 and the first semiconductor material layer 310 of the semiconductor structure 300, the length HA1 of the first doped region DA1 may be in a range of about 1,800 nm to 2,500 nm, the length HA2 of the second doped region DA2 may be in a range of about 500 nm to about 1,200 nm, and the length HA3 of the third doped region DA3 may be in a range of about 1,500 to about 2,200 nm. When each of the doped regions DA1 through DA3 has the above doping concentration n(x) and length HA1, HA2 or HA3, the doping concentration index IDC of the first semiconductor layer 31 of the light-emitting element ED3 may be equal to greater than about $2.5*10^{11}$ atoms/cm.

When the length HA1 of the first doped region DA1 is the smallest as in the embodiment of FIG. 21, the doping concentration of the first doped region DA1 may be less than each of the doping of the second doped region DA2 and the doping concentration of the third doped region DA3, and the doping concentration of the second doped region DA2 may be less than each of the doping concentration of the first doped region DA1 and the doping concentration of the third doped region DA3. For example, the first semiconductor layer 31 may have a doping concentration profile in which the doping concentration n(x) decreases from the first interface $l_0$ with the light emitting layer 36 toward the end surface $l_3$ or a doping concentration profile in which the doping concentration n(x) decreases and then increases.

In embodiments, the doping concentration of the first doped region DA1 may be less than each of the doping concentration of the second doped region DA2 and the doping concentration of the third doped region DA3, and the doping concentration of the second doped region DA2 may be less than the doping concentration of the third doped region DA3. For example, the doping concentration of the n-type dopant may be equal to or greater than about $6*10^{18}$ atoms/cm³ in the third doped region DA3 and the doping concentration of the n-type dopant may be equal to or less than about $6*10^{18}$ atoms/cm³ in the first doped region DA1 and in the second doped region DA2. The length HA1 of the first doped region DA1 may be in a range of about 500 nm to about 1,200 nm, the length HA2 of the second doped region DA2 may be in a range of about 1,800 nm to about 2,500 nm, and the length HA3 of the third doped region DA3 may be in a range of about 1,500 nm to about 2,200 nm.

In other embodiments, the doping concentration of the first doped region DA1 and the doping concentration of the third doped region DA3 may each be greater than the doping concentration of the second doped region DA2, and the doping concentration of the first doped region DA1 and the doping concentration of the third doped region DA3 may be equal. For example, the doping concentration of the n-type dopant of the first doped region DA1 and the doping concentration of the n-type dopant of the third doped region DA3 may each independently be equal to or greater than about $6*10^{18}$ atoms/cm³ and the doping concentration of the n-type dopant of the second doped region DA2 may be equal to or less than about $6*10^{18}$ atoms/cm³. The length HA1 of the first doped region DA1 may be in a range of about 500 nm to about 1,200 nm, the length HA2 of the second doped region DA2 may be in a range of about 1,800 nm to about 2,500 nm, and the length HA3 of the third doped region DA3 may be in a range of about 1,500 nm to about 2,200 nm. When each of the doped regions DA1 through DA3 has the above doping concentration n(x) and length HA1, HA2, or HA3, the doping concentration index IDC of the first semiconductor layer 31 of the light-emitting element ED3 may be greater than about $2.5*10^{11}$ atoms/cm.

Figure 22:
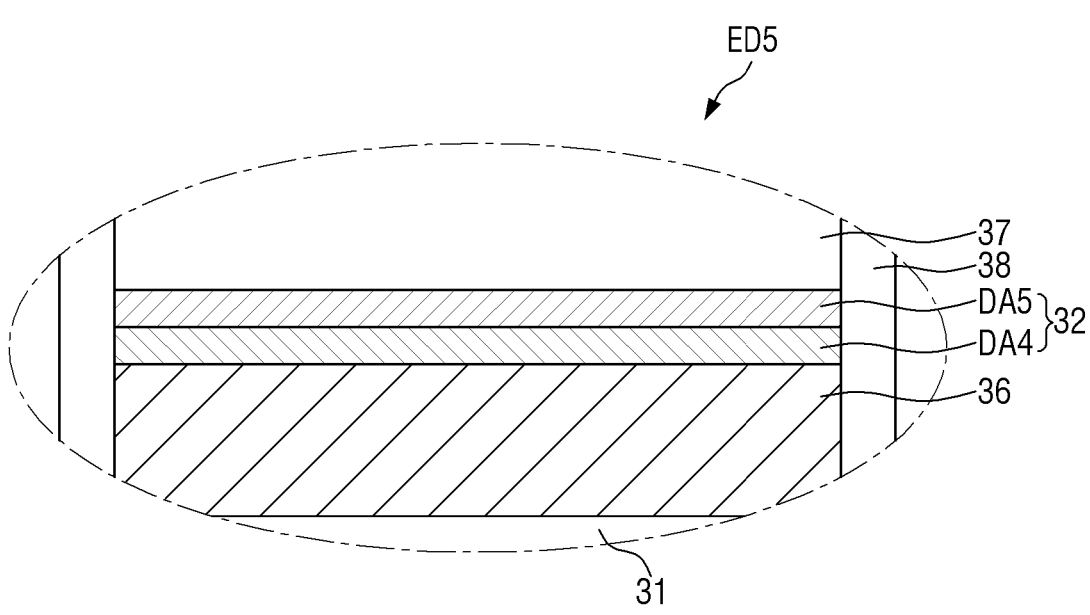
FIG. 22 is an enlarged view of a second semiconductor layer of a light-emitting element according to an embodiment.

FIG. 22 is an enlarged view of a second semiconductor layer 32 of a light-emitting element ED5 according to an embodiment.

Referring to FIG. 22, in the light-emitting element ED5 according to the embodiment, the second semiconductor layer 32 may also include doped regions DA4 and DA5 having different doping concentrations. For example, the second semiconductor layer 32 may include a fourth doped region DA4 and a fifth doped region DA5 having a different doping concentration of a p-type dopant from the fourth doped region DA4. The fourth doped region DA4 may contact a light emitting layer 36, and the fifth doped region DA5 may be disposed between the fourth doped region DA4 and an electrode layer 37. As in Equation 1 above, a doping concentration index of the second semiconductor layer 32 may be defined as a value obtained by integrating the product of a doping concentration n(x) and a distance x from an interface between the fourth doped region DA4 and the light emitting layer 36 to an interface between the fifth doped region DA5 and the electrode layer 37. In the second semiconductor layer 32, the doping concentration of each of the doped regions DA4 and DA5 may be adjusted to have a doping concentration index equal to or greater than a value of an embodiment so that a dipole moment of the light-emitting element ED5 may have a large value.

The shape and material of the light-emitting element ED are not limited to those of FIG. 5. In embodiments, the light-emitting element ED may include a larger number of layers or may have a different shape.

Figure 23:
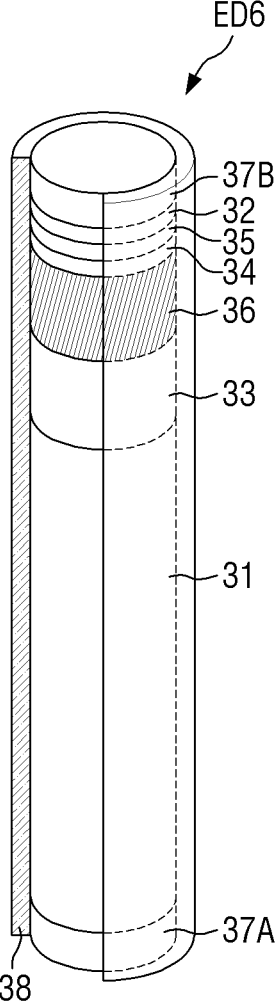
FIG. 23 is a schematic diagram of a light-emitting element according to an embodiment.
Figure 24:
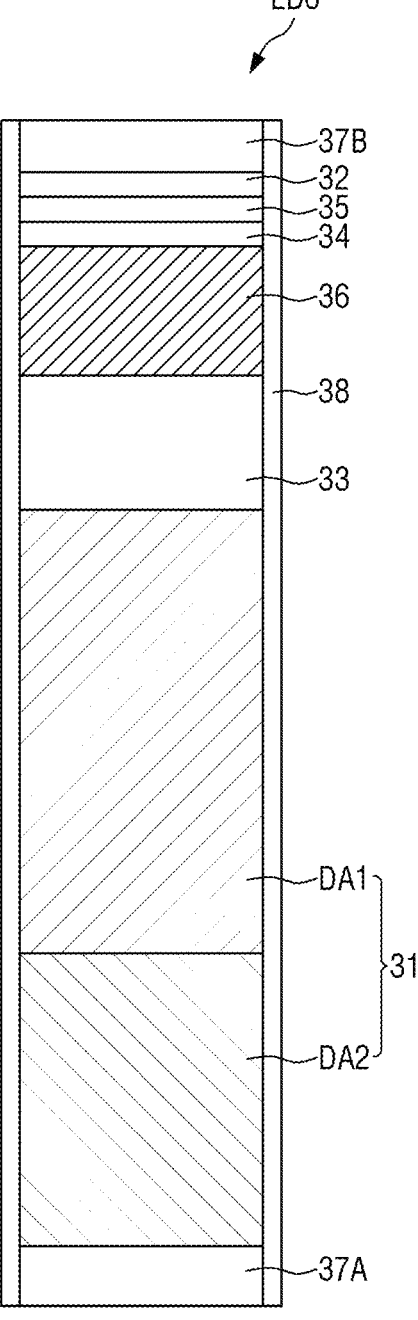
FIG. 24 is a schematic cross-sectional view of the light-emitting element of FIG. 23.

FIG. 23 is a schematic diagram of a light-emitting element ED6 according to an embodiment. FIG. 24 is a schematic cross-sectional view of the light-emitting element ED6 of FIG. 23. FIG. 24 illustrates a schematic cross section of the light-emitting element ED6 of FIG. 23 taken in the longitudinal direction and illustrates a stack of semiconductor layers.

Referring to FIGS. 23 and 24, the light-emitting element ED6 according to the embodiment may further include a third semiconductor layer 33 disposed between a first semiconductor layer 31 and a light emitting layer 36 and a fourth semiconductor layer 34 and a fifth semiconductor layer 35 disposed between the light emitting layer 36 and a second semiconductor layer 32. The light-emitting element ED6 of FIGS. 23 and 24 is different from the embodiment of FIG. 5 in that it further includes semiconductor layers 33 through 35 and electrode layers 37A and 37B and that the light emitting layer 36 contains a different element. Any redundant description will be omitted, and differences will be described below.

In the light-emitting element ED of FIG. 5, the light emitting layer 36 may include nitrogen (N) to emit blue light or green light. In another embodiment, in the light-emitting element ED6 of FIG. 23, each of the light emitting layer 36 and other semiconductor layers may be a semiconductor including phosphorous (P). The light-emitting element ED6 according to the embodiment may emit red light having a central wavelength band in a range of about 620 nm to about 750 nm.

The first semiconductor layer 31 may be an n-type semiconductor layer and may include a semiconductor material having a chemical formula of $In_xAl_yGa_{1-x-y}P$ ($0 \le x \le 1$, $0 \le y \le 1$, $0 \le x+y \le 1$). The first semiconductor layer 31 may be any one or more of n-type doped InAlGaP, GaP, AlGaP, InGaP, AlP, or InP. For example, the first semiconductor layer 31 may be n-AlGaInP doped with n-type Si.

The second semiconductor layer 32 may be a p-type semiconductor layer and may include a semiconductor material having a chemical formula of $In_xAl_yGa_{1-x-y}P$ ($0 \le x \le 1$, $0 \le y \le 1$, $0 \le x+y \le 1$). The second semiconductor layer 32 may be any one or more of p-type doped InAlGaP, GaP, AlGaP, InGaP, AlP, or InP. For example, the second semiconductor layer 32 may be p-GaP doped with p-type Mg.

The light emitting layer 36 may be made of a material including phosphorous (P) and may include a material having a single or multiple quantum well structure to emit light in a specific wavelength band. A quantum layer of the light emitting layer 36 may include AlGaP or AlInGaP, and a well layer may include a material such as GaP or AlInP. For example, the light emitting layer 36 may include AlGaInP as the quantum layer and AlInP as the well layer to emit red light having a central wavelength band in a range of about 620 nm to about 750 nm.

The light-emitting element ED6 may include a clad layer disposed adjacent to the light emitting layer 36. As illustrated in the drawings, the third semiconductor layer 33 and the fourth semiconductor layer 34 disposed below and above the light emitting layer 36 between the first semiconductor layer 31 and the second semiconductor layer 32 may be clad layers.

The third semiconductor layer 33 may be disposed between the first semiconductor layer 31 and the light emitting layer 36. Like the first semiconductor layer 31, the third semiconductor layer 33 may be an n-type semiconductor and may include a semiconductor material having a chemical formula of $In_xAl_yGa_{1-x-y}P$ ($0 \le x \le 1$, $0 \le y \le 1$, $0 \le x+y \le 1$). For example, the first semiconductor layer 31 may be n-AlGaInP, and the third semiconductor layer 33 may be n-AlInP, but the disclosure is not limited thereto.

The fourth semiconductor layer 34 may be disposed between the light emitting layer 36 and the second semiconductor layer 32. Like the second semiconductor layer 32, the fourth semiconductor layer 34 may be a p-type semiconductor and may include a semiconductor material having a chemical formula of $In_xAl_yGa_{1-x-y}P$ ($0 \le x \le 1$, $0 \le y \le 1$, $0 \le x+y \le 1$). For example, the second semiconductor layer 32 may be p-GaP, and the fourth semiconductor layer 34 may be p-AlInP.

The fifth semiconductor layer 35 may be disposed between the fourth semiconductor layer 34 and the second semiconductor layer 32. Like the second semiconductor layer 32 and the fourth semiconductor layer 34, the fifth semiconductor layer 35 may be a p-type doped semiconductor. In embodiments, the fifth semiconductor layer 35 may reduce a difference in lattice constant between the fourth semiconductor layer 34 and the second semiconductor layer 32. The fifth semiconductor layer 35 may be a tensile strain barrier reducing layer. For example, the fifth semiconductor layer 35 may include, but is not limited to, p-GaInP, p-AlInP, or p-AlGaInP.

A first electrode layer 37A and a second electrode layer 37B may be disposed on a surface of the first semiconductor layer 31 and a surface of the second semiconductor layer 32, respectively. The first electrode layer 37A may be disposed on a lower surface of the first semiconductor layer 31, and the second electrode layer 37B may be disposed on an upper surface of the second semiconductor layer 32. However, the disclosure is not limited thereto, and at least any one of the first electrode layer 37A and the second electrode layer 37B may be omitted. For example, in the light-emitting element ED6, the first electrode layer 37A may not be disposed on the lower surface of the first semiconductor layer 31, and only one second electrode layer 37B may be disposed on the upper surface of the second semiconductor layer 32. The light-emitting element ED6 according to the embodiment may emit red light by including a larger number of semiconductor layers.

A light-emitting element according to an embodiment includes a semiconductor layer having a doping concentration index value equal to or greater than a value of an embodiment to have a large dipole moment.

A display device according to an embodiment includes the above light-emitting elements. Accordingly, the proportion of forward-oriented light-emitting elements may increase, and the luminous efficiency and manufacturing yield may increase.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting element comprising:

a first semiconductor layer doped with an n-type dopant;

a second semiconductor layer doped with a p-type dopant;

a light emitting layer disposed between the first semiconductor layer and the second semiconductor layer; and an insulating film that surrounds the first semiconductor layer, the second semiconductor layer, and the light emitting layer, wherein an index of doping concentration of the first semiconductor layer is expressed by Equation 1 such that the index of doping concentration of the first semiconductor layer is defined based on a distance from a position of an interface between the first semiconductor layer and the light emitting layer and an end surface of the first semiconductor layer which is opposite the interface between the first semiconductor layer and the light emitting layer, and is equal to or greater than $2.5*10^{11}$ atoms/cm:

$$\text{IDC (Index of doping concentration)} = \int_{l_0}^{l} n(x)x\,dx \qquad \text{[Equation 1]}$$

wherein in Equation 1, $l_0$ is the position of an interface between a semiconductor layer and the light emitting layer, $l$ is the position of an end surface of the semiconductor layer which is opposite the interface with the light emitting layer, $x$ is a distance from $l_0$ to $l$, and $n(x)$ is the doping concentration of a dopant according to an x value of the semiconductor layer, wherein the first semiconductor layer comprises:

a first doped region that contacts the light emitting layer, a second doped region that contacts the first doped region, and a third doped region that contacts the second doped region, wherein the first doped region has a length in a range of about 1,800 nm to about 2,500 nm, wherein the second doped region has a length in a range of about 500 nm to about 1,200 nm, wherein the third doped region has a length in a range of about 1,500 nm to about 2,200 nm, wherein a doping concentration of the n-type dopant of the first doped region is greater than a doping concentration of the n-type dopant of the second doped region, wherein the doping concentration of the n-type dopant of the second doped region is greater than a doping concentration of the n-type dopant of the third doped region, wherein doping concentrations of the n-type dopant within the same doped region are the same regardless of position within the same doped region, and wherein each of the doping concentrations of the n-type dopant of the first to third doped region is equal to or greater than $1*10^{18}$ atoms/cm$^3$.

2. The light-emitting element of claim 1, wherein the index of doping concentration of the first semiconductor layer is equal to $4*10^{11}$ atoms/cm.

3. A display device comprising:

a first electrode and a second electrode disposed on a substrate and spaced apart from each other;

a first insulating layer disposed on the first electrode and the second electrode;

light-emitting elements disposed on the first insulating layer and disposed on the first electrode and the second electrode;

a first connection electrode that contacts an end of each of the light-emitting elements; and a second connection electrode that contacts another end of each of the light-emitting elements, wherein each of the light-emitting elements comprises:

a first semiconductor layer doped with an n-type dopant;

a second semiconductor layer doped with a p-type dopant;

a light emitting layer disposed between the first semiconductor layer and the second semiconductor layer; and an insulating film that surrounds the first semiconductor layer, the second semiconductor layer, and the light emitting layer, an index of doping concentration of the first semiconductor layer is expressed by Equation 1 such that the index of doping concentration of the first semiconductor layer is defined based on a distance from a position of an interface between the first semiconductor layer and the light emitting layer and an end surface of the first semiconductor layer which is opposite the interface between the first semiconductor layer and the light emitting layer, and is equal to or greater than $2.5*10^{11}$ atoms/cm, and a number of light-emitting elements include first ends at which the first semiconductor layer is disposed and second ends opposite to the first ends, wherein the first ends contact the second connection electrode and the second ends contact the first connection electrode, and a proportion of the number of light-emitting elements among the light-emitting elements is equal to or greater than 60%:

$$\text{IDC (Index of doping concentration)} = \int_{l_0}^{l} n(x)x\,dx \qquad \text{[Equation 1]}$$

wherein in Equation 1, $l_0$ is the position of an interface between a semiconductor layer and the light emitting layer, $l$ is the position of an end surface of the semiconductor layer which is opposite the interface with the light emitting layer, $x$ is a distance from $l_0$ to $l$, and $n(x)$ is the doping concentration of a dopant according to an x value of the semiconductor layer, wherein the first semiconductor layer comprises:

a first doped region that contacts the light emitting layer, a second doped region that contacts the first doped region, and a third doped region that contacts the second doped region, wherein the first doped region has a length in a range of about 1,800 nm to about 2,500 nm, wherein the second doped region has a length in a range of about 500 nm to about 1,200 nm, wherein the third doped region has a length in a range of about 1,500 nm to about 2,200 nm, wherein a doping concentration of the n-type dopant of the first doped region is greater than a doping concentration of the n-type dopant of the second doped region,

wherein the doping concentration of the n-type dopant of the second doped region is greater than a doping concentration of the n-type dopant of the third doped region, wherein doping concentrations of the n-type dopant within same doped region are same regardless of position within the same doped region, and wherein each of the doping concentrations of the n-type dopant of the first to third doped region is equal to or greater than $1*10^{18}$ atoms/cm$^3$.

4. The display device of claim 3, wherein the index of doping concentration of the first semiconductor layer in each of the light-emitting elements is equal to or greater than $4*10^{11}$ atoms/cm, a number of the light-emitting elements include first ends at which the first semiconductor layer is disposed and second ends opposite to the first ends, wherein the first ends contact the second connection electrode and the second ends contact the first connection electrode, and a proportion of the number of light-emitting elements among the light-emitting elements is equal to or greater than 80%.

5. A semiconductor structure comprising:

a first semiconductor layer doped with an n-type dopant;

a second semiconductor layer doped with a p-type dopant;

a light emitting layer disposed between the first semiconductor layer and the second semiconductor layer; and an insulating film that surrounds the first semiconductor layer, the second semiconductor layer, and the light emitting layer, wherein the first semiconductor layer comprises:

a first doped region that contacts the light emitting layer, a second doped region that contacts the first doped region, and a third doped region that contacts the second doped region, wherein the first doped region has a length in a range of about 1,800 nm to about 2,500 nm, wherein the second doped region has a length in a range of about 500 nm to about 1,200 nm, wherein the third doped region has a length in a range of about 1,500 nm to about 2,200 nm, wherein a doping concentration of the n-type dopant of the first doped region is greater than a doping concentration of the n-type dopant of the second doped region, wherein the doping concentration of the n-type dopant of the second doped region is greater than a doping concentration of the n-type dopant of the third doped region, wherein doping concentrations of the n-type dopant within same doped region are same regardless of position within the same doped region, and wherein each of the doping concentrations of the n-type dopant of the first to third doped region is equal to or greater than $1*10^{18}$ atoms/cm$^3$.

6. The semiconductor structure of claim 5, wherein the doping concentration of the n-type dopant of the first semiconductor layer is equal to or greater than $6*10^{18}$ atoms/cm$^3$.

7. The semiconductor structure of claim 5, wherein the doping concentration of the n-type dopant of the first doped region is equal to or greater than $6*10^{18}$ atoms/cm$^3$, and the doping concentration of the n-type dopant of each of the second doped region and the third doped region is equal to or less than $6*10^{18}$ atoms/cm$^3$.

8. The semiconductor structure of claim 5, wherein the doping concentration of the n-type dopant of each of the first doped region and the second doped region is equal to or less than $6*10^{18}$ atoms/cm$^3$, and the doping concentration of the n-type dopant of the third doped region is equal to or greater than $6*10^{18}$ atoms/cm$^3$.

9. The semiconductor structure of claim 5, wherein the doping concentration of the n-type dopant of each of the first doped region and the third doped region is equal to or greater than $6*10^{18}$ atoms/cm$^3$, and the doping concentration of the n-type dopant of the second doped region is equal to or less than $6*10^{18}$ atoms/cm$^3$.

* * * * *